US010252905B2

(12) United States Patent
Okumura

(10) Patent No.: US 10,252,905 B2
(45) Date of Patent: Apr. 9, 2019

(54) SEMICONDUCTOR DEVICE AND METHOD OF MANUFACTURING THE SAME

(71) Applicant: Mitsubishi Electric Corporation, Tokyo (JP)

(72) Inventor: Mika Okumura, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 15/541,653

(22) PCT Filed: Feb. 24, 2015

(86) PCT No.: PCT/JP2015/055211
§ 371 (c)(1),
(2) Date: Jul. 5, 2017

(87) PCT Pub. No.: WO2016/135852
PCT Pub. Date: Sep. 1, 2016

(65) Prior Publication Data
US 2017/0341929 A1 Nov. 30, 2017

(51) Int. Cl.
*B81B 3/00* (2006.01)
*G01P 15/125* (2006.01)
(Continued)

(52) U.S. Cl.
CPC ........ *B81B 3/0051* (2013.01); *B81C 1/00825* (2013.01); *G01P 15/0802* (2013.01);
(Continued)

(58) Field of Classification Search
CPC .......... B81B 3/0051; B81B 2201/0235; B81B 2203/0118; G01P 15/0802; G01P 15/125;
(Continued)

(56) References Cited

U.S. PATENT DOCUMENTS 5,572,057 A 11/1996 Yamamoto et al.
2006/0086186 A1* 4/2006 Ichikawa ............... G01P 1/023
73/514.36
(Continued)

FOREIGN PATENT DOCUMENTS

JP H07-176767 A 7/1995
JP 2004-223713 A 8/2004
(Continued)

OTHER PUBLICATIONS

International Search Report issued in PCT/JP2015/055211; dated Jun. 2, 2015.

*Primary Examiner* — Marc Anthony Armand
*Assistant Examiner* — Sue Tang
(74) *Attorney, Agent, or Firm* — Studebaker & Brackett PC

(57) ABSTRACT

A semiconductor device includes a substrate, a beam, a movable structural body, a first stopper member, a second stopper member and a third stopper member. The first stopper member is arranged with a first gap from the movable structural body in an in-plane direction. The second stopper member is arranged with a second gap from the movable structural body in an out-of-plane direction. The third stopper member is arranged opposite to the second stopper member with the movable structural body interposed therebetween in the out-of-plane direction, and is arranged with a third gap from the movable structural body. Consequently, there can be provided a semiconductor device in which excessive displacement of the movable structural body can be suppressed to thereby suppress damage to and breakage of the beam supporting the movable structural body, and a method of manufacturing the same.

2 Claims, 34 Drawing Sheets

(51) Int. Cl.
*G01P 15/18* (2013.01)
*B81C 1/00* (2006.01)
*G01P 15/08* (2006.01)

(52) U.S. Cl.
CPC ............ *G01P 15/125* (2013.01); *G01P 15/18* (2013.01); *B81B 2201/0235* (2013.01); *B81B 2203/0118* (2013.01); *B81C 2201/013* (2013.01); *B81C 2201/0109* (2013.01); *G01P 2015/082* (2013.01); *G01P 2015/084* (2013.01); *G01P 2015/0871* (2013.01)

(58) Field of Classification Search
CPC .......... B81C 1/00825; B81C 2201/013; B81C 2201/0109
USPC ........................................................ 257/418
See application file for complete search history.

(56) References Cited

U.S. PATENT DOCUMENTS

| | | | |
|---|---|---|---|
| 2006/0272413 A1* | 12/2006 | Vaganov | G01P 15/123 73/514.01 |
| 2008/0110260 A1 | 5/2008 | Konno et al. | |
| 2010/0005884 A1* | 1/2010 | Weinberg | G01C 19/5719 73/504.15 |

FOREIGN PATENT DOCUMENTS

| | | |
|---|---|---|
| JP | 2006-153518 A | 6/2006 |
| JP | 2008-139282 A | 6/2008 |

* cited by examiner

SEMICONDUCTOR DEVICE AND METHOD OF MANUFACTURING THE SAME

TECHNICAL FIELD

The present invention relates to semiconductor devices and methods of manufacturing the same, and particularly to a semiconductor device such as an acceleration sensor and a method of manufacturing the same.

BACKGROUND ART

A semiconductor acceleration sensor manufactured using a process of manufacturing a semiconductor device has been conventionally used. An example of this semiconductor acceleration sensor is disclosed, for example, in Japanese Patent Laying-Open No. 2008-139282 (PTD 1). In this acceleration sensor, a detection frame is supported by a substrate via a torsion beam so as to be rotatable. An inertia mass body is supported by the detection frame via a link beam so as to be displaceable in a thickness direction of the substrate. A detection electrode is formed on the substrate so as to face the detection frame.

In this acceleration sensor, when acceleration is applied in a direction perpendicular to the substrate, the inertia mass body is displaced in the direction perpendicular to the substrate. This displacement of the inertia mass body is transferred to the detection frame via the link beam, causing the detection frame to rotate around the torsion beam. This rotation leads to a change in distance between the detection frame and the detection electrode, which leads to a change in capacitance between the detection frame and the detection electrode. The acceleration is measured from this change in capacitance.

In a method of manufacturing this acceleration sensor, after the detection electrode is formed on the substrate, a sacrificial film is deposited on the entire substrate. After the detection frame (movable structural body) is formed on this sacrificial film, this sacrificial film is removed, so that the detection frame (movable structural body) is rendered displaceable. Then, a cap is supported on the substrate so as to cover the detection frame (movable structural body).

CITATION LIST

Patent Document

PTD 1: Japanese Patent Laying-Open No. 2008-139282

SUMMARY OF INVENTION

Technical Problem

In the acceleration sensor described in the above publication, an external force such as surface tension of liquid and an excessive impact force may act in a manufacturing step, an inspection step, a usage state and the like after the detection frame (movable structural body) is rendered displaceable. The action of such an external force may cause excessive displacement of the detection frame (movable structural body). Consequently, stress greater than or equal to stress that causes a fracture (fracture stress) is applied to the torsion beam supporting the detection frame (movable structural body), resulting in damage to and breakage of the torsion beam due to cracks. As a result, the characteristics of the acceleration sensor vary and are adversely affected.

The present invention was made in view of the problems described above, and has an object to provide a semiconductor device in which excessive displacement of a movable structural body can be suppressed to thereby suppress damage to and breakage of a beam supporting the movable structural body, and a method of manufacturing the same.

Solution to Problem

A semiconductor device of the present invention includes a substrate, a beam, a movable structural body, a first stopper member, a second stopper member and a third stopper member. The substrate has a surface. The beam is supported by the substrate. The movable structural body is supported by the beam so as to be displaceable in an in-plane direction and an out-of-plane direction with respect to the surface of the substrate. The first stopper member is supported by the substrate, and is arranged, with the movable structural body being in a stationary state, with a first gap from the movable structural body in the in-plane direction. The second stopper member is supported by the first stopper member, and is arranged, with the movable structural body being in a stationary state, with a second gap from the movable structural body in the out-of-plane direction. The third stopper member is supported by the first stopper member, is arranged opposite to the second stopper member with the movable structural body interposed therebetween in the out-of-plane direction, and is arranged, with the movable structural body being in a stationary state, with a third gap from the movable structural body.

Advantageous Effects of Invention

According to the present invention, when the movable structural body is displaced in the in-plane direction of the surface of the substrate, the movable structural body comes into contact with the first stopper member, so that excessive displacement of the movable structural body in the in-plane direction can be suppressed. In addition, when the movable structural body is displaced toward the substrate in the out-of-plane direction of the surface of the substrate, the movable structural body comes into contact with the second stopper member, so that excessive displacement of the movable structural body toward the substrate in the out-of-plane direction can be suppressed. In addition, when the movable structural body is displaced to the side opposite to the second stopper member with respect to the movable structural body in the out-of-plane direction of the surface of the substrate, the movable structural body comes into contact with the third stopper member, so that excessive displacement of the movable structural body to the side opposite to the second stopper member with respect to the movable structural body in the out-of-plane direction can be suppressed. Accordingly, the excessive displacement of the movable structural body in the in-plane direction and out-of-plane direction of the surface of the substrate can be suppressed, to thereby suppress the application of stress greater than or equal to the fracture stress to the beam supporting the movable structural body in the in-plane direction and out-of-plane direction. Consequently, damage to and breakage of the beam can be suppressed.

DESCRIPTION OF EMBODIMENTS

Embodiments of the present invention will be described below based on the drawings.

First Embodiment

Figure 1:
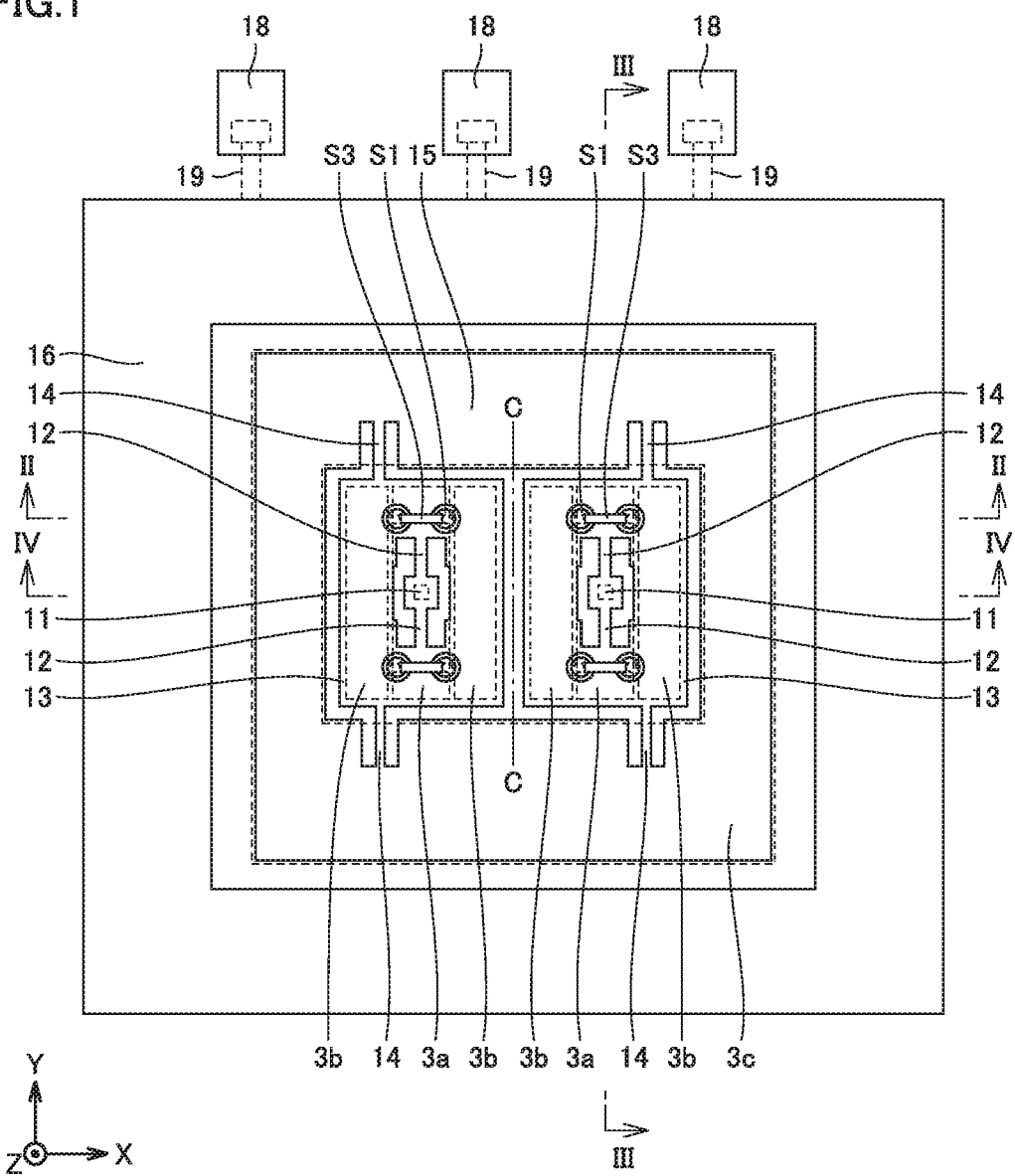
FIG. 1 is a plan view schematically showing the configuration of an acceleration sensor as a semiconductor device in a first embodiment of the present invention.

First, the configuration of an acceleration sensor as a semiconductor device of the present embodiment is described using FIGS. 1 to 4. It is noted that an X direction, a Y direction and a Z direction are introduced for convenience of explanation. In FIG. 1, the X direction is a direction in which two movable structural bodies 13 are adjacent to each other. In the X direction, the rightward direction in FIG. 1 is the positive direction (+X direction), and the leftward direction in FIG. 1 is the negative direction (−X direction). The Y direction is a direction orthogonal to the X direction, and is a direction in which a beam 12 and a link beam 14 extend. In the Y direction, the upward direction in FIG. 1 is the positive direction (+Y direction), and the downward direction in FIG. 1 is the negative direction (−Y direction). The Z direction is a direction orthogonal to both the X direction and the Y direction, and is an up-and-down direction orthogonal to a surface 1S of a substrate 1A (direction in which substrate 1A and movable structural bodies 13 shown in FIG. 2 face each other). In the Z direction, the direction toward the front of the plane of the drawing of FIG. 1 perpendicularly to the plane of the drawing is the positive direction (+Z direction), and the direction toward the back of the plane of the drawing perpendicularly to the plane of the drawing is the negative direction (−Z direction). It is noted that the Z direction coincides with a direction of acceleration to be measured by the acceleration sensor of the present embodiment. It is noted that a cap 17 is not shown in FIG. 1 for clarity.

With reference to FIGS. 1 to 4, the acceleration sensor of the present embodiment is semiconductor acceleration sensor manufactured using a process of manufacturing a semiconductor device. The acceleration sensor of the present embodiment mainly has a substrate 1A, an anchor portion 11, a beam 12, a movable structural body 13, a link beam 14, an inertia mass body 15, a first stopper member S1, a second stopper member S2 and a third stopper member S3.

Figure 2:
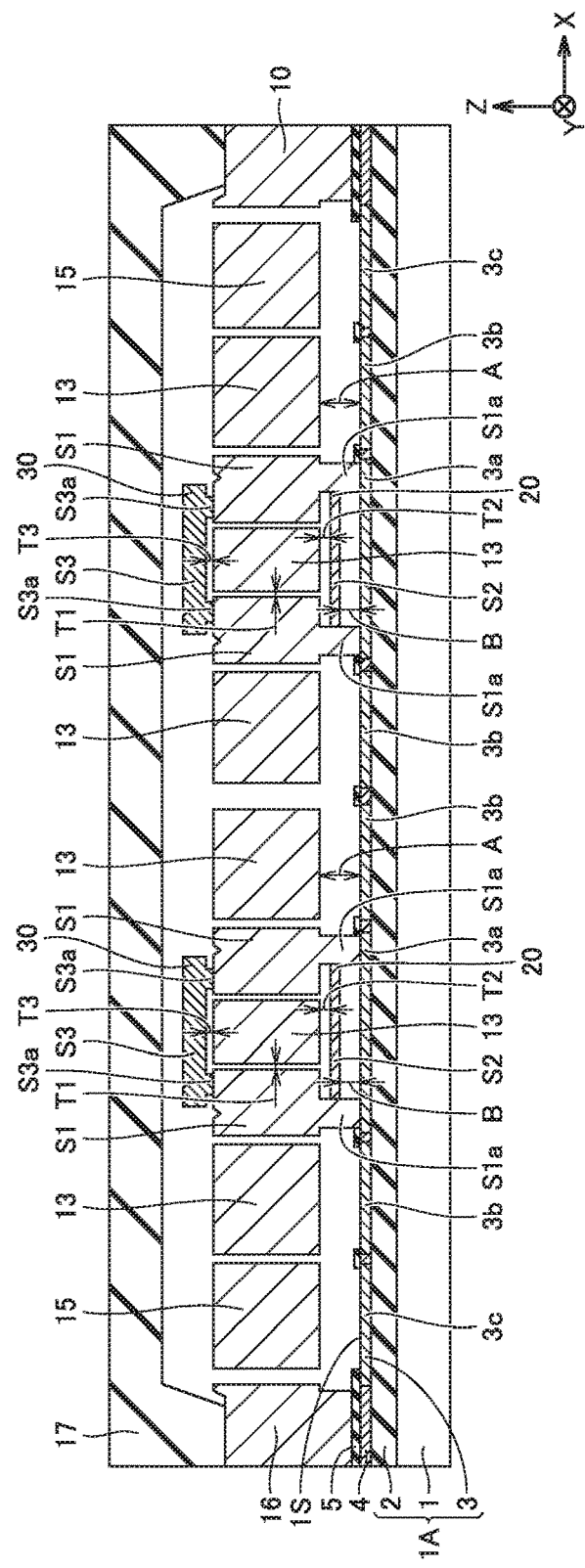
FIG. 2 is a schematic cross-sectional view taken along line II-II in FIG. 1.
Figure 3:
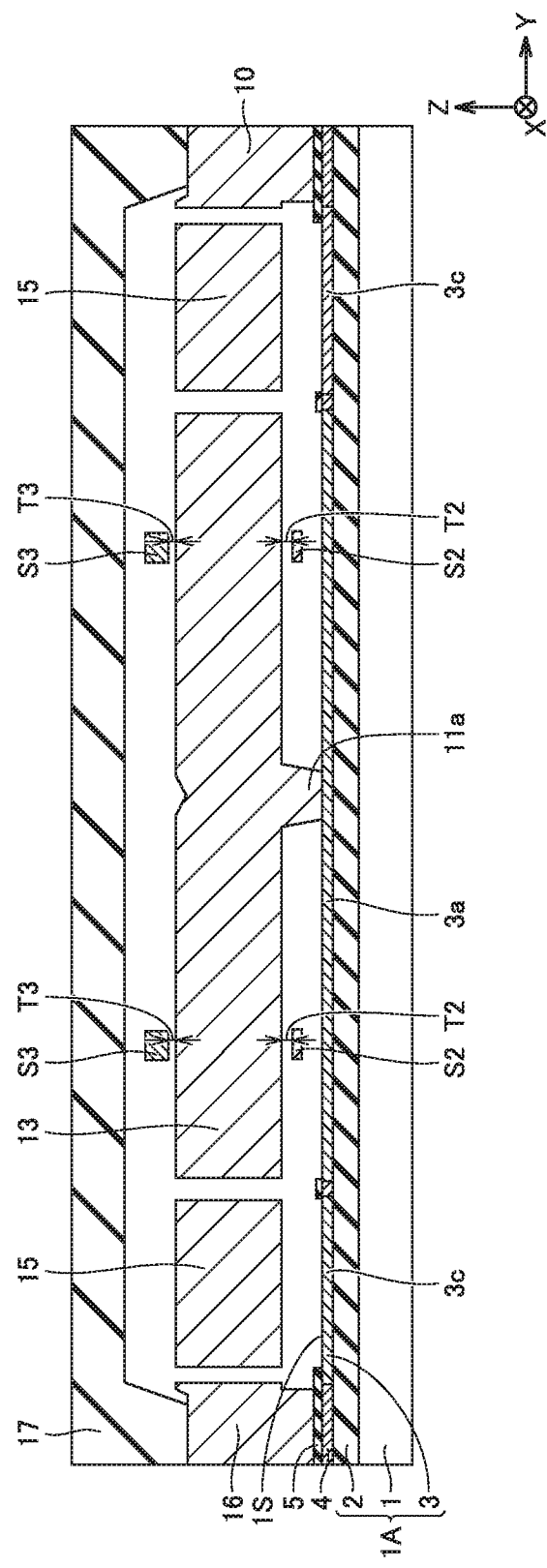
FIG. 3 is a schematic cross-sectional view taken along line in FIG. 1.
Figure 4:
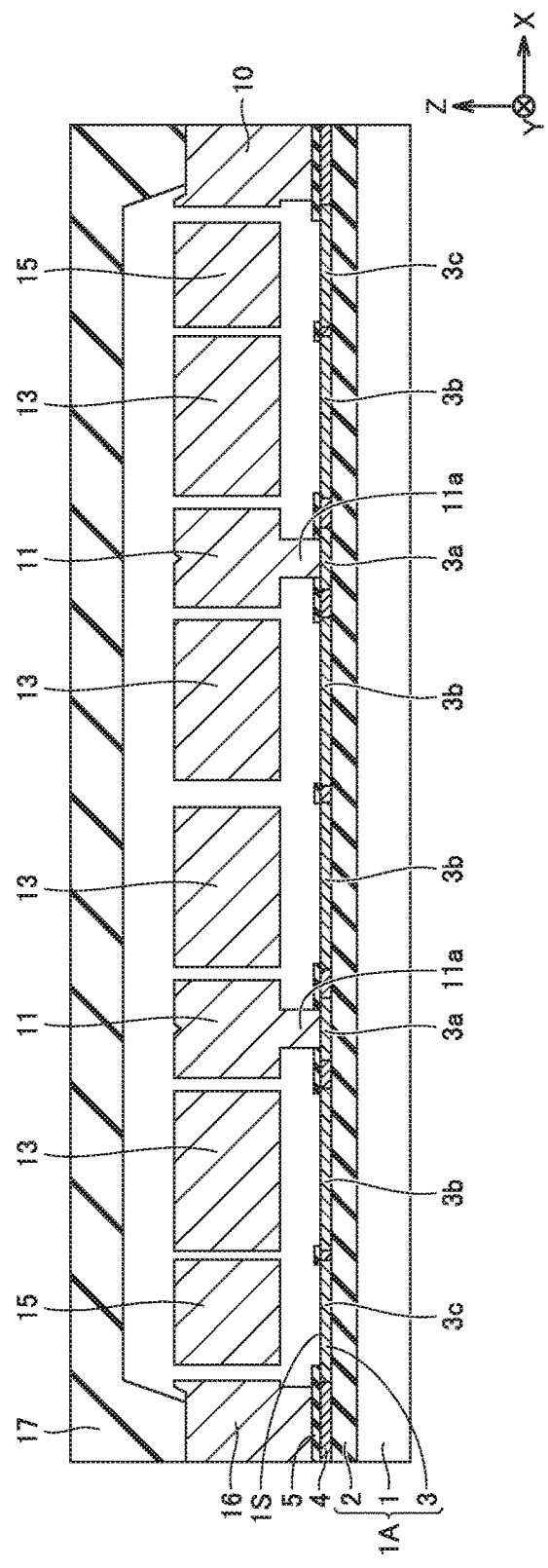
FIG. 4 is a schematic cross-sectional view taken along line IV-IV in FIG. 1.

With reference to FIGS. 2 to 4, substrate 1A has a surface 1S. Substrate 1A has a substrate body 1, a first insulating film 2 and a conductive film 3. First insulating film 2 is formed on substrate body 1. Conductive film 3 is formed on first insulating film 2. A second insulating film 4 is also formed on first insulating film 2. A silicon substrate can be used, for example, as substrate body 1. A silicon oxide film can be used, for example, as first insulating film 2. A polycrystalline silicon film having a conductive property can be used, for example, as conductive film 3. A silicon oxide film can be used, for example, as second insulating film 4.

Conductive film 3 has an anchor support portion 3a, a detection electrode 3b and a fixed electrode 3c. Anchor support portion 3a, detection electrode 3b and fixed electrode 3c are formed, for example, by separating the same polycrystalline silicon film into the respective sections by patterning.

With reference to FIGS. 1, 3 and 4, anchor portion 11 is formed on anchor support portion 3a with a support portion 11a interposed therebetween. Anchor portion 11 is thereby supported by substrate 1A. Beam 12 extends from anchor portion 11 to opposite sides in the Y direction. Beam 12 is a torsion beam, and is supported by anchor portion 11 such that it can be distorted around an axis of beam 12 extending in the Y direction.

With reference to FIGS. 1 and 2, movable structural body 13 is supported by beam 12 so as to be displaceable in the in-plane direction and out-of-plane direction with respect to surface 1S of substrate 1A. Movable structural body 13 has the shape of a frame in plan view, and is connected to beam 12 at two locations on the inside of the frame shape. Movable structural body 13 is supported by substrate 1A with beam 12 interposed therebetween, so as to be rotatable around beam 12. At least a part of movable structural body 13 has a conductive property. Movable structural body 13 is arranged to face detection electrode 3b in the Z direction. Two detection electrodes 3b face one movable structural body 13. Two detection electrodes 3b extend in the Y direction, and are adjacent to each other in the X direction. Movable structural body 13 is arranged at a distance A in the Z direction from surface 1S of substrate 1A.

Link beam 14 is connected to two locations on the outside of the frame shape of movable structural body 13. An axis of link beam 14 extending in the Y direction is shifted in the X direction from the axis of beam 12 extending in the Y direction.

There are provided two sets, for example, each set including anchor portion 11, beam 12, movable structural body 13 and link beam 14 described above. These two sets are arranged line symmetrically with respect to an imaginary center line C-C extending in the Y direction between these sets in plan view.

Inertia mass body 15 has the shape of a frame to surround the above two sets in plan view. This inertia mass body 15 is connected to each link beam 14 on the inside of the frame shape. Consequently, one inertia mass body 15 is connected to each of movable structural bodies 13 of the above two sets with each link beam 14 interposed therebetween. At least a part of inertia mass body 15 has a conductive property. Inertia mass body 15 is arranged to face fixed electrode 3c in the Z direction. Fixed electrode 3c has the shape of a frame in plan view.

A sealing portion 16 has the shape of a frame to surround inertia mass body 15 in plan view. This sealing portion 16 is supported on substrate 1A with second insulating film 4 and a third insulating film 5 interposed therebetween. Third insulating film 5 is formed on second insulating film 4. A silicon nitride film can be used, for example, as third insulating film 5.

Anchor portion 11, beam 12, movable structural body 13, link beam 14, inertia mass body 15 and sealing portion 16 described above are formed of a single conductive film 10, which is a polycrystalline silicon film having a conductive property, for example.

A cap 17 is provided on sealing portion 16. Cap 17 is formed to cover the region surrounded by sealing portion 16. Cap 17 is made of glass, for example. Cap 17 is for preventing entry of molding resin and the like into the region surrounded by sealing portion 16 and cap 17. Consequently, movable structural body 13 in a movable state and the like in this region are protected.

First stopper member S1 is supported by substrate 1A. First stopper member S1 is formed on conductive film 3. First stopper member S1 is formed on anchor support portion 3a with a support portion S1a interposed therebetween. First stopper member S1 is arranged, with movable structural body 13 being in a stationary state, with a first gap T1 from movable structural body 13 in the in-plane direction. First stopper member S1 is arranged with first gap T1 from movable structural body 13 in both the X direction and the Y direction. In the present embodiment, first stopper member S1 is arranged with first gap T1 from movable structural body 13 in all directions in the in-plane direction. That is, first gap T1 is provided all around first stopper member S1 in the in-plane direction. No other member is arranged between first stopper member S1 and movable structural body 13 in the in-plane direction.

In the present embodiment, four first stopper members S1 are provided for one movable structural body 13. Four first stopper members S1 are provided such that two first stopper members S1 are provided on each side of anchor portion 11 in the Y direction. In each of the two sets of first stopper members S1 provided on each side of anchor portion 11 in the Y direction, two first stopper member S1 are arranged next to each other in the X direction. These two first stopper members S1 are arranged on opposite sides of beam 12 in the X direction, respectively. First stopper members S1 are arranged in the vicinity of beam 12.

Like anchor portion 11, beam 12, movable structural body 13, link beam 14, inertia mass body 15 and sealing portion 16, first stopper member S1 is formed of conductive film 10, which is a polycrystalline silicon film having a conductive property, for example.

Second stopper member S2 is supported by first stopper member S1. Second stopper member S2 is provided across two first stopper members S1 next to each other on opposite sides of beam 12 in the X direction, so as to connect two first stopper members S1 together. Second stopper member S2 is connected to support portion S1a of each of these two first stopper members S1. In the present embodiment, two second stopper members S2 are provided for one movable structural body 13.

Second stopper member S2 is arranged, with movable structural body 13 being in a stationary state, with a second gap T2 from movable structural body 13 in the out-of-plane direction. Second stopper member S2 is arranged between movable structural body 13 and substrate 1A in the Z direction. In the present embodiment, second stopper member S2 is arranged with second gap T2 from movable structural body 13 in the +Z direction. Second stopper member S2 is arranged in the vicinity of beam 12. Second stopper member S2 is formed of a conductive film 20, which is a polycrystalline silicon film having a conductive property, for example.

Third stopper member S3 is supported by first stopper member S1. Third stopper member S3 is provided across two first stopper members S1 next to each other on opposite sides of beam 12 in the X direction, so as to connect two first stopper members S1 together. Third stopper member S3 is connected to the surfaces of these first stopper members S1 at contact portions S3a. First stopper member S1 has a role as a foundation for third stopper member S3. In the present embodiment, two third stopper members S3 are provided for one movable structural body 13.

Third stopper member S3 is arranged opposite to second stopper member S2 with movable structural body 13 interposed therebetween in the out-of-plane direction, and is arranged, with movable structural body 13 being in a stationary state, with a third gap T3 from movable structural body 13. Third stopper member S3 is arranged between movable structural body 13 and cap 17 in the Z direction. In the present embodiment, third stopper member S3 is arranged with third gap T3 from movable structural body 13 in the −Z direction. Third stopper member S3 is arranged in the vicinity of beam 12. Third stopper member S3 is formed of a conductive film 30, which is a polycrystalline silicon film having a conductive property, for example. As shown in FIG. 3, second stopper member S2 and third stopper member S3 are arranged such that movable structural body 13 lies therebetween.

Each of first gap T1, second gap T2 and third gap T3 has a dimension smaller than an amount of displacement that causes stress that causes a fracture of beam 12 due to displacement of movable structural body 13 in the in-plane direction and out-of-plane direction of surface 1S of substrate 1A.

The acceleration sensor of the present embodiment has an electrode pad 18 for electric connection to the outside. Electrode pad 18 is electrically connected to detection electrode 3b, fixed electrode 3c, movable structural body 13 and inertia mass body 15 through a wire 19. Electrode pad 18 is made of aluminum, for example.

Next, with reference to FIGS. 1 and 2, the principle of operation of the acceleration sensor of the present embodiment is described.

In the acceleration sensor of the present embodiment, when acceleration is applied in a direction perpendicular to substrate 1A, inertia mass body 15 is displaced in the up-and-down direction (Z direction) with respect to substrate 1A. This displacement of inertia mass body 15 is transferred to movable structural body 13 via link beam 14, causing movable structural body 13 to rotate around the axis of beam 12 extending in the Y direction. This rotation leads to a change in distance between movable structural body 13 and detection electrode 3b, which leads to a change in capacitance between movable structural body 13 and detection electrode 3b. The acceleration is detected by converting the capacitance into a voltage proportional to acceleration by a capacitance-voltage conversion circuit.

Next, with reference to FIGS. 1 and 5 to 7, a description is given of a state in which an external force is applied to the acceleration sensor of the present embodiment in the in-plane direction and out-of-plane direction of surface 1S of substrate 1A. Examples of this external force include surface tension of liquid and an excessive impact force. Here, an example where acceleration is applied as an external force to the acceleration sensor of the present embodiment is described.

Figure 5:
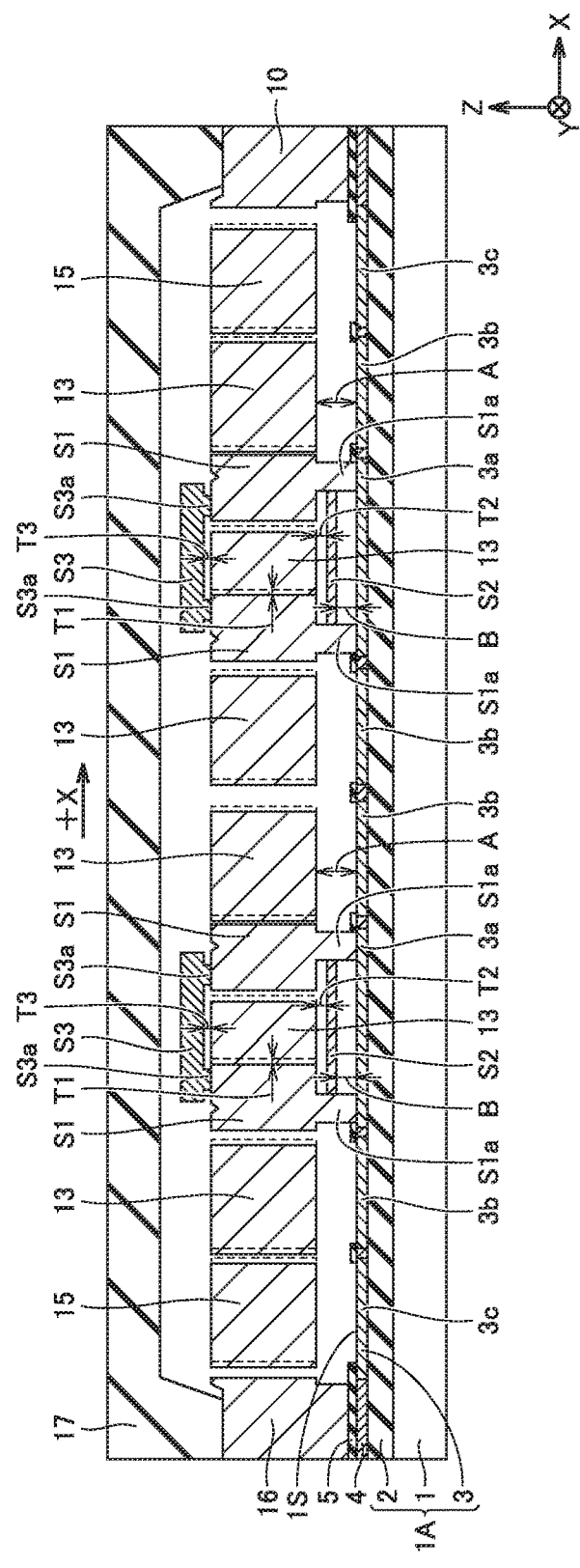
FIG. 5 is a schematic cross-sectional view for illustrating operation when acceleration is applied in the in-plane direction (+X direction) to the acceleration sensor as a semiconductor device in the first embodiment of the present invention.

With reference mainly to FIG. 5, when acceleration is applied to the acceleration sensor of the present embodiment in the +X direction of the arrow in the drawing in the in-plane direction, movable structural body 13 is displaced in the opposite direction (−X direction) to the +X direction of the arrow in the drawing. At this time, displaced movable structural body 13 comes into contact with first stopper member S1, and movable structural body 13 is thus prevented from being displaced greater than the dimension of first gap T1.

Figure 6:
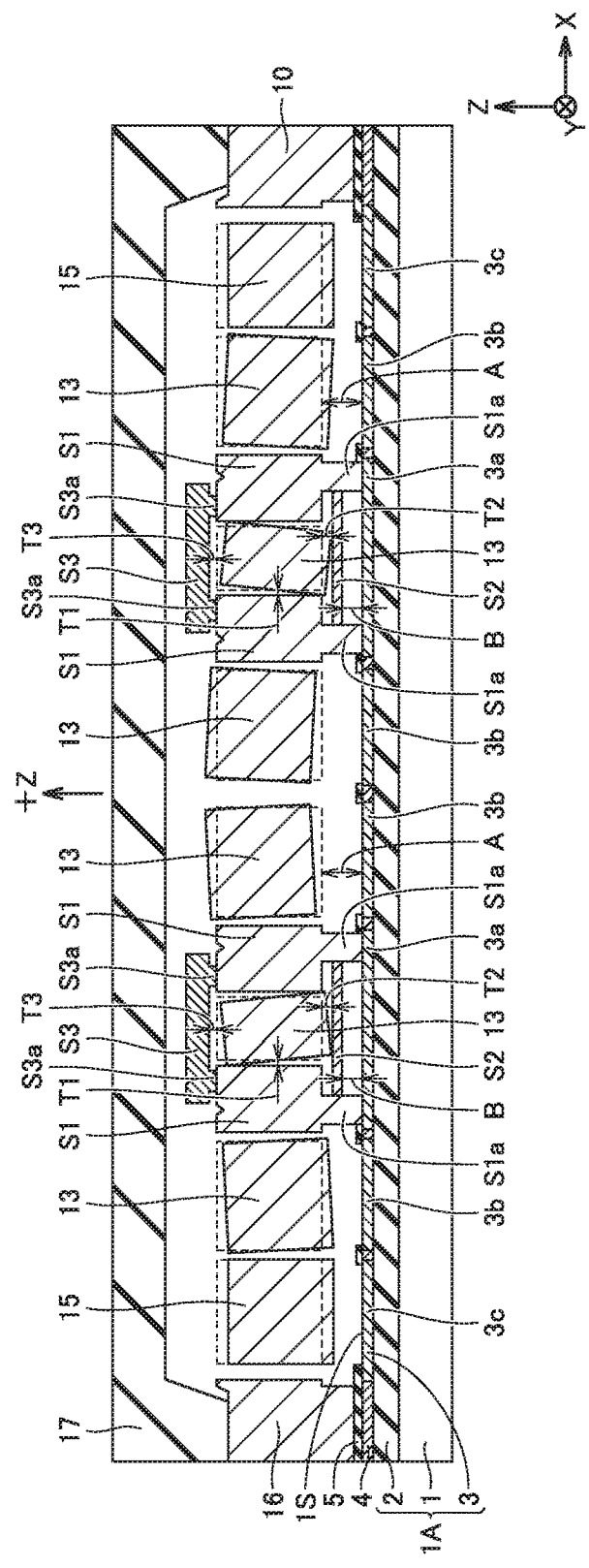
FIG. 6 is a schematic cross-sectional view for illustrating operation when acceleration is applied in the out-of-plane direction (+Z direction) to the acceleration sensor as a semiconductor device in the first embodiment of the present invention.

With reference mainly to FIG. 6, when acceleration is applied to the acceleration sensor of the present embodiment in the +Z direction of the arrow in the drawing in the out-of-plane direction, inertia mass body 15 is displaced in the opposite direction (−Z direction) to the +Z direction of the arrow in the drawing. This displacement of inertia mass body 15 is transferred to movable structural body 13 via link beam 14, causing movable structural body 13 to rotate around the axis of beam 12 extending in the Y direction. Consequently, a portion of movable structural body 13 facing second stopper member S2 is displaced in the −Z direction. Movable structural body 13 displaced in the −Z direction comes into contact with second stopper member S2, and movable structural body 13 is thus prevented from being displaced greater than the dimension of second gap T2.

Figure 7:
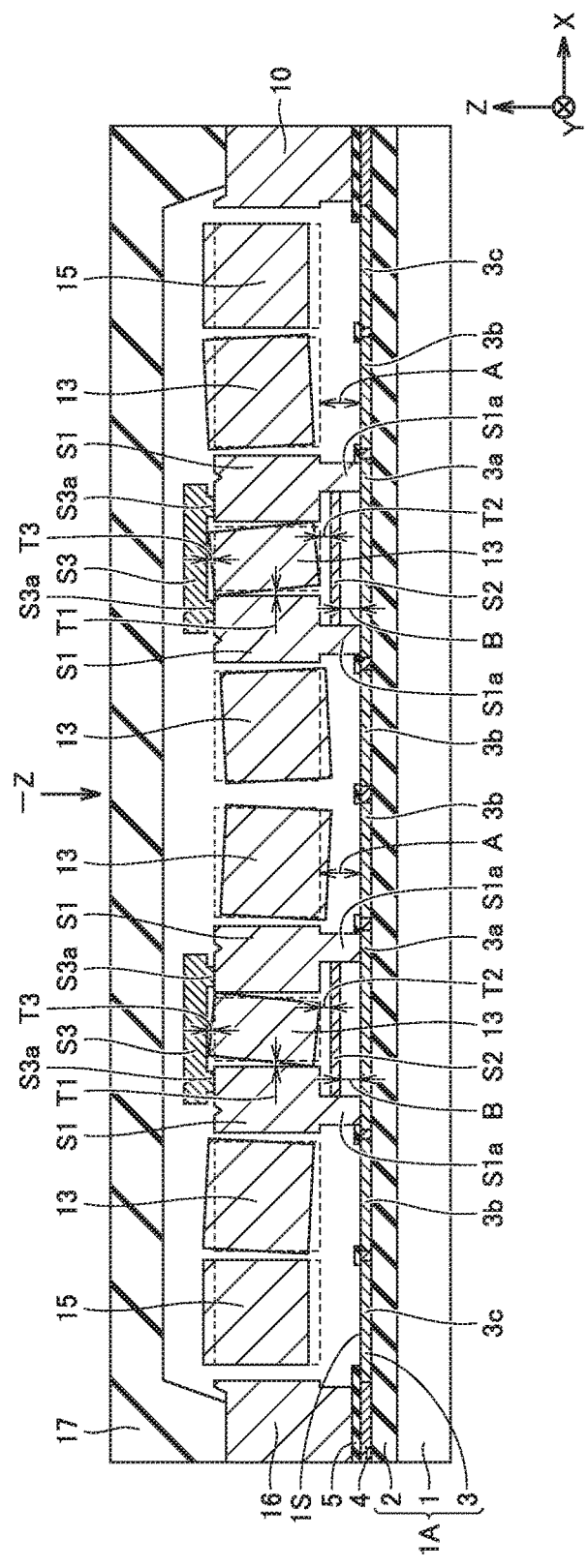
FIG. 7 is a schematic cross-sectional view for illustrating operation when acceleration is applied in the out-of-plane direction (−Z direction) to the acceleration sensor as a semiconductor device in the first embodiment of the present invention.

With reference mainly to FIG. 7, when acceleration is applied to the acceleration sensor of the present embodiment in the −Z direction of the arrow in the drawing in the out-of-plane direction, inertia mass body 15 is displaced in the opposite direction (+Z direction) to the −Z direction of the arrow in the drawing. This displacement of inertia mass body 15 is transferred to movable structural body 13 via link beam 14, causing movable structural body 13 to rotate around the axis of beam 12 extending in the Y direction.

Consequently, a portion of movable structural body 13 facing third stopper member S3 is displaced in the +Z direction. Movable structural body 13 displaced in the +Z direction comes into contact with third stopper member S3, and movable structural body 13 is thus prevented from being displaced greater than the dimension of third gap T3.

Next, a method of manufacturing the acceleration sensor as a method of manufacturing a semiconductor device of the present embodiment is described using FIGS. 8 to 17.

Figure 8:
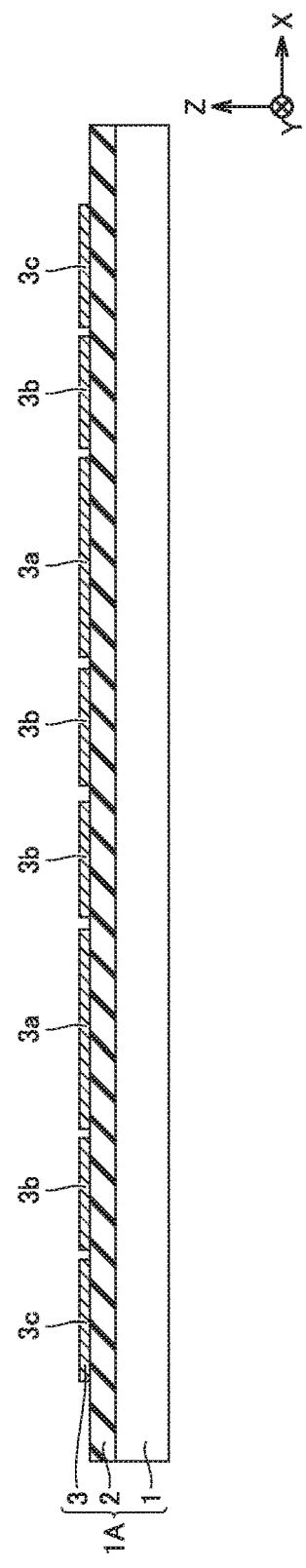
FIG. 8 is a schematic cross-sectional view showing a first step of a method of manufacturing the semiconductor device in the first embodiment of the present invention, which corresponds to the cross-sectional position of FIG. 2.

With reference to FIG. 8, first insulating film 2 formed of a silicon oxide film, for example, is formed on the surface of substrate body 1 made of silicon, for example. Conductive film 3 made of polycrystalline silicon, for example, is formed on first insulating film 2. This conductive film 3 is patterned using a photolithography technique and an etching technique, to form anchor support portion 3a, detection electrode 3b and fixed electrode 3c from this conductive film 3. Consequently, substrate 1A formed of substrate body 1, first insulating film 2 and patterned conductive film 3 is formed.

Figure 9:
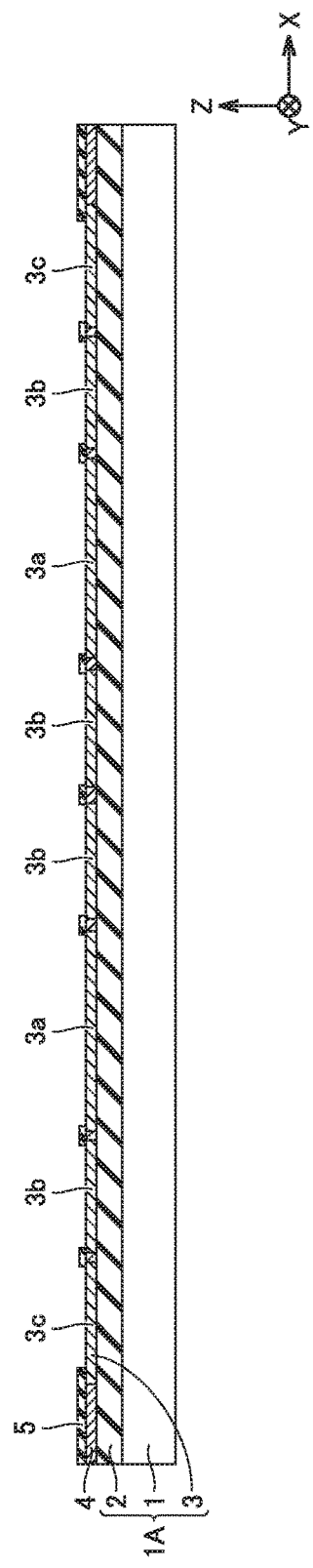
FIG. 9 is a schematic cross-sectional view showing a second step of the method of manufacturing the semiconductor device in the first embodiment of the present invention, which corresponds to the cross-sectional position of FIG. 2.

With reference to FIG. 9, second insulating film 4 formed of a silicon oxide film, for example, is formed in regions between anchor support portion 3a, detection electrode 3b and fixed electrode 3c. Second insulating film 4 is formed such that it is flattened to be substantially flush with the surfaces of anchor support portion 3a, detection electrode 3b and fixed electrode 3c. Then, third insulating film 5 formed of a silicon nitride film, for example, is formed to cover the surfaces of anchor support portion 3a, detection electrode 3b, fixed electrode 3c and second insulating film 4. This third insulating film 5 is patterned using a photolithography technique and an etching technique, to selectively expose anchor support portion 3a, detection electrode 3b and fixed electrode 3c at third insulating film 5.

Figure 10:
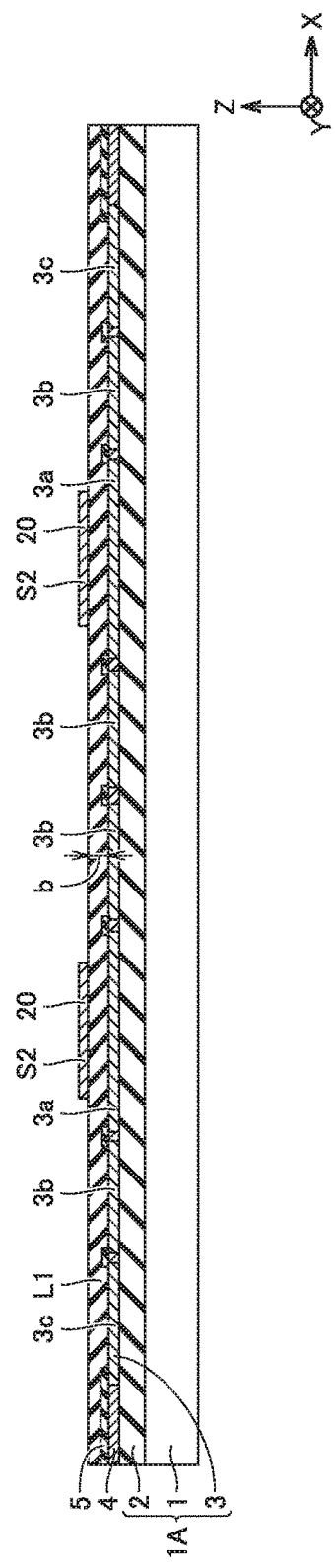
FIG. 10 is a schematic cross-sectional view showing a third step of the method of manufacturing the semiconductor device in the first embodiment of the present invention, which corresponds to the cross-sectional position of FIG. 2.

With reference to FIG. 10, a first sacrificial film L1 made of phospho silicate glass (PSG), for example, is formed to have a film thickness b, so as to cover anchor support portion 3a, detection electrode 3b and fixed electrode 3c selectively exposed at third insulating film 5, and third insulating film 5. Then, conductive film 20 made of polycrystalline silicon, for example, is formed on first sacrificial film L1. This conductive film 20 is patterned using a photolithography technique and an etching technique, to form second stopper member S2. In addition, first sacrificial film L1 is selectively exposed at conductive film 20.

Figure 11:
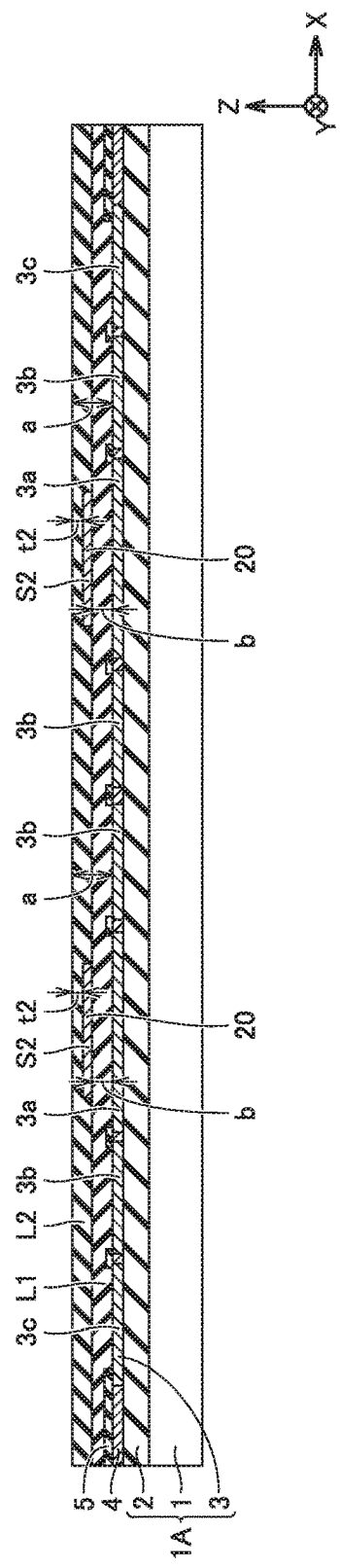
FIG. 11 is a schematic cross-sectional view showing a fourth step of the method of manufacturing the semiconductor device in the first embodiment of the present invention, which corresponds to the cross-sectional position of FIG. 2.

With reference to FIG. 11, a second sacrificial film L2 made of phospho silicate glass (PSG), for example, is formed to cover first sacrificial film L1 selectively exposed at conductive film 20, and second stopper member S2. Second sacrificial film L2 is formed to have a film thickness t2 directly above second stopper member S2. This film thickness t2 will be the thickness of second gap T2 in the Z direction described above. Second sacrificial film L2 is also formed to have a total film thickness a of first sacrificial film L1 and second sacrificial film L2. This film thickness a will be distance A from surface 1S of substrate 1A to movable structural body 13 in the Z direction described above.

Figure 12:
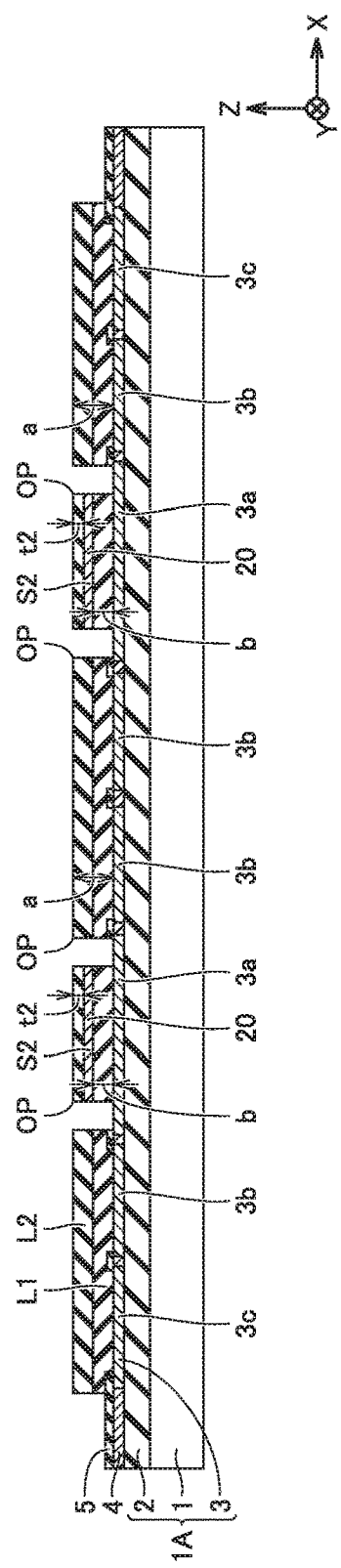
FIG. 12 is a schematic cross-sectional view showing a fifth step of the method of manufacturing the semiconductor device in the first embodiment of the present invention, which corresponds to the cross-sectional position of FIG. 2.

With reference to FIG. 12, first sacrificial film L1 and second sacrificial film L2 are patterned using a photolithography technique and an etching technique, to form an opening OP extending through first sacrificial film L1 and second sacrificial film L2 to reach anchor support portion 3a.

Figure 13:
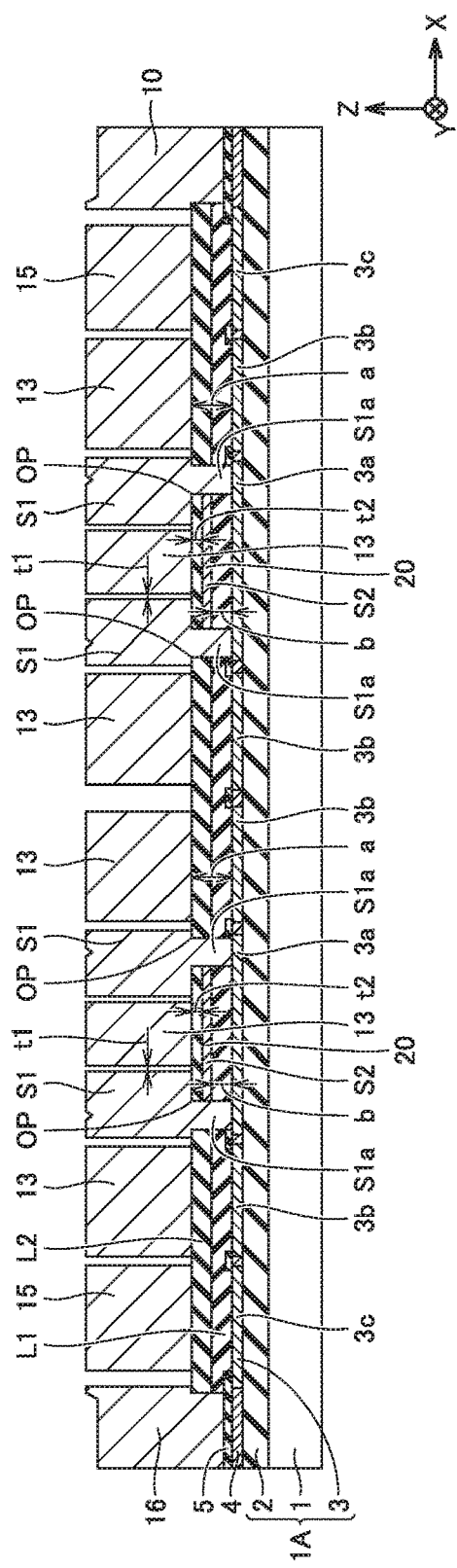
FIG. 13 is a schematic cross-sectional view showing a sixth step of the method of manufacturing the semiconductor device in the first embodiment of the present invention, which corresponds to the cross-sectional position of FIG. 2.

With reference to FIG. 13, conductive film 10 made of polycrystalline silicon, for example, is formed to cover second sacrificial film L2 and anchor support portion 3a. This conductive film 10 is formed to fill opening OP. A portion of conductive film 10 filling opening OP constitutes support portion S1a of first stopper member S1. This portion also constitutes a part of sealing portion 16. This portion also constitutes support portion 11a of anchor portion 11 shown in FIGS. 3 and 4. This conductive film 10 is patterned using a photolithography technique and an anisotropic etching technique, to form the anchor portion (not shown), the beam (not shown), movable structural body 13, the link beam (not shown), inertia mass body 15, sealing portion 16 and first stopper member S1. A distance t1 between the patterns of movable structural body 13 and first stopper member S1 will be the width of first gap T1 described above.

Figure 14:
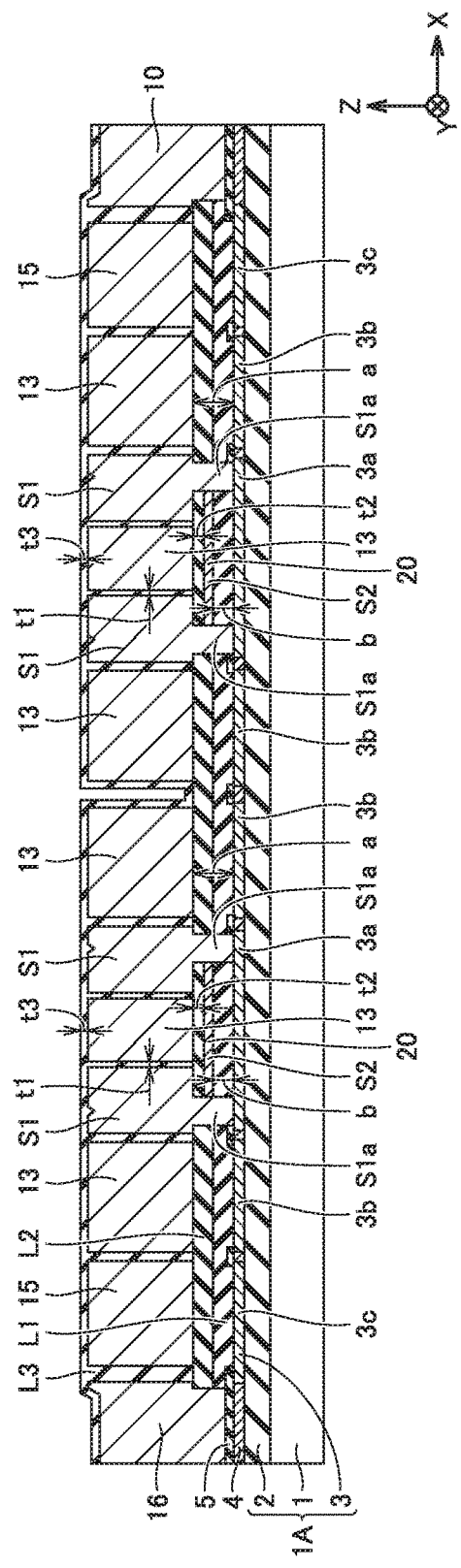
FIG. 14 is a schematic cross-sectional view showing a seventh step of the method of manufacturing the semiconductor device in the first embodiment of the present invention, which corresponds to the cross-sectional position of FIG. 2.

With reference to FIG. 14, a third sacrificial film L3 formed of an insulating oxide film such as a TEOS (Tetra Ethyl Ortho Silicate) film is formed to cover the anchor portion (not shown), the beam (not shown), movable structural body 13, the link beam (not shown), inertia mass body 15, sealing portion 16, first stopper member S1 and second sacrificial film L2. Third sacrificial film L3 is formed to have a film thickness t3 directly above movable structural body 13. This film thickness t3 will be the thickness of third gap T3 in the Z direction described above.

Figure 15:
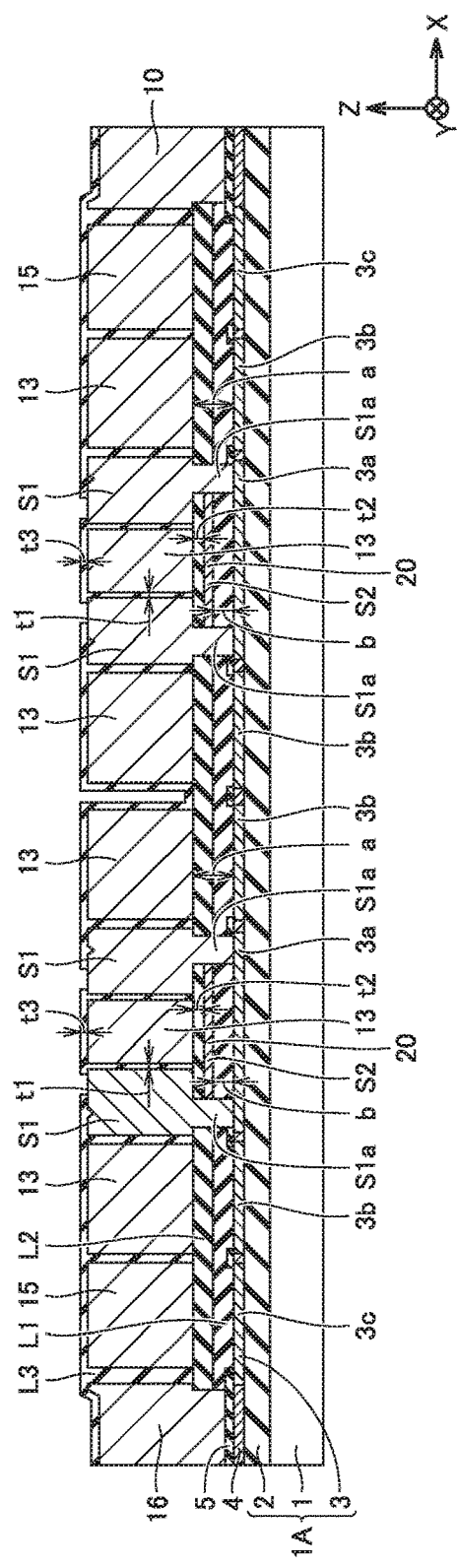
FIG. 15 is a schematic cross-sectional view showing an eighth step of the method of manufacturing the semiconductor device in the first embodiment of the present invention, which corresponds to the cross-sectional position of FIG. 2.

With reference to FIG. 15, third sacrificial film L3 is patterned using a photolithography technique and an etching technique, to selectively expose first stopper member S1 at third sacrificial film L3.

Figure 16:
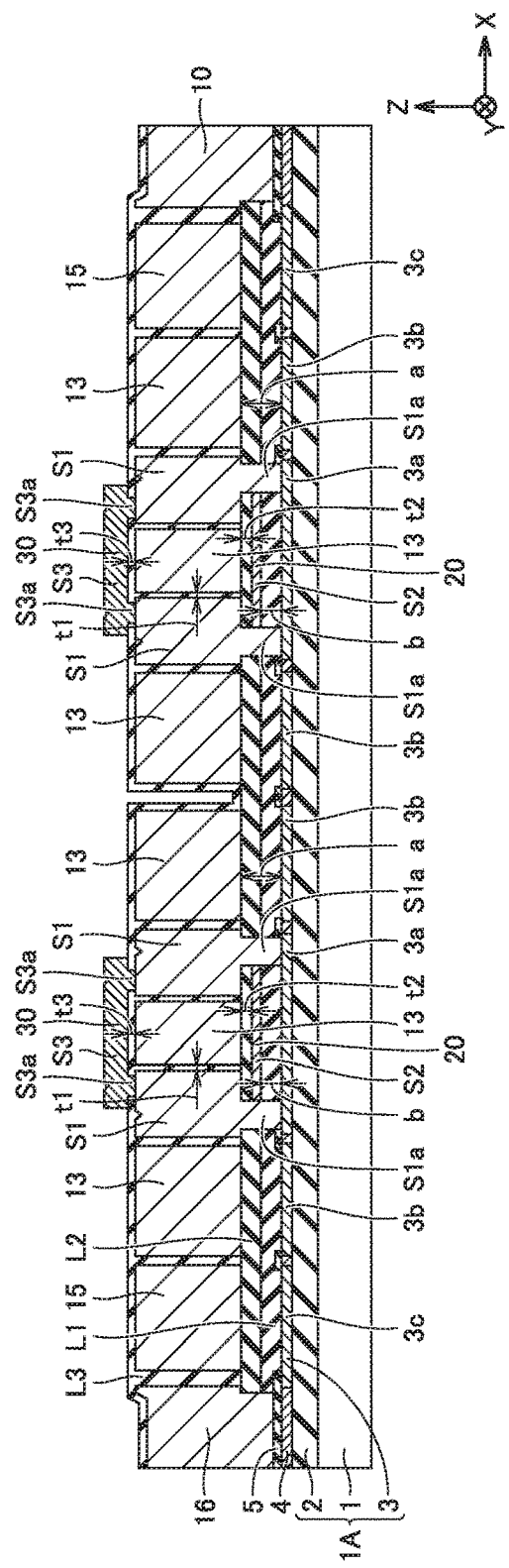
FIG. 16 is a schematic cross-sectional view showing a ninth step of the method of manufacturing the semiconductor device in the first embodiment of the present invention, which corresponds to the cross-sectional position of FIG. 2.

With reference to FIG. 16, conductive film 30 is formed to cover first stopper member S1 selectively exposed at third sacrificial film L3, and third sacrificial film L3. This conductive film 30 is formed to fill the patterned region of third sacrificial film L3. This conductive film 30 is patterned using a photolithography technique and an etching technique, to form third stopper member S3. Conductive film 30 filling the patterned region of third sacrificial film L3 constitutes contact portion S3a.

Figure 17:
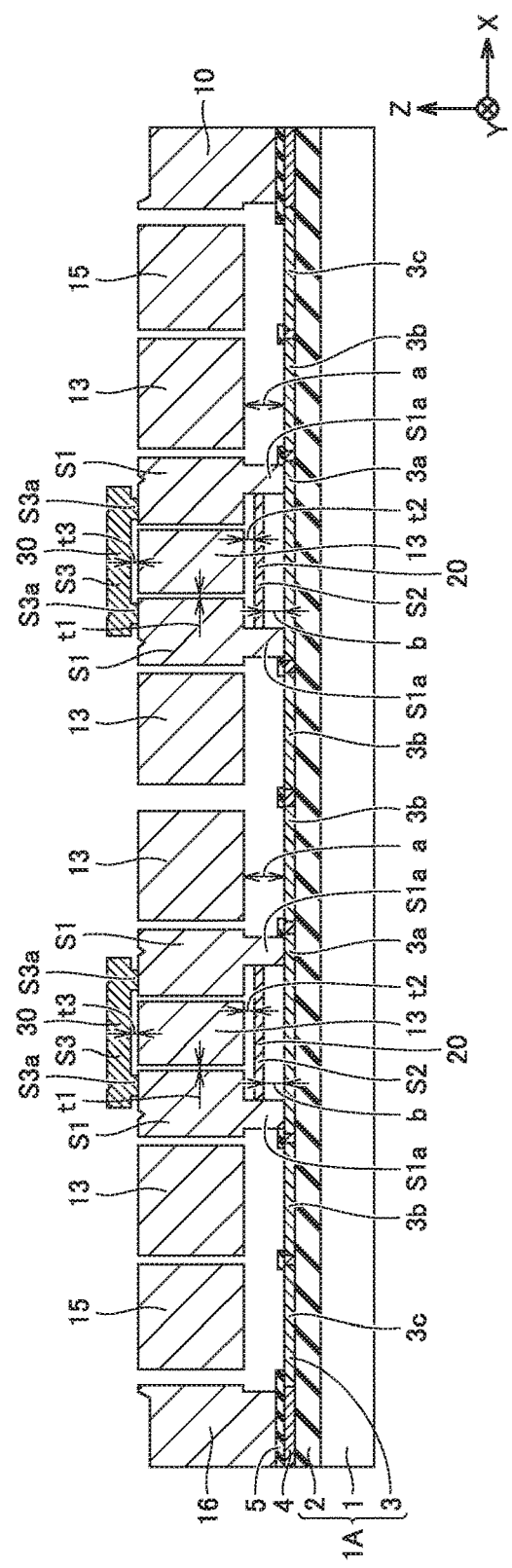
FIG. 17 is a schematic cross-sectional view showing a tenth step of the method of manufacturing the semiconductor device in the first embodiment of the present invention, which corresponds to the cross-sectional position of FIG. 2.

With reference to FIG. 17, a wet etching process with a hydrofluoric acid solution or the like is performed to remove a sacrificial layer formed of first sacrificial film L1, second sacrificial film L2 and third sacrificial film L3. Consequently, a support structure is formed in which the beam (not shown), movable structural body 13, the link beam (not shown) and inertia mass body 15 are supported by substrate 1A, with a gap from substrate 1A. Then, cap 17 shown in FIG. 2 is anodically bonded, for example, to sealing portion 16. Subsequently, assembly and sealing with molding resin is carried out to perform packaging.

Next, the function and effect of the present embodiment will be described.

According to the acceleration sensor as a semiconductor device of the present embodiment, as shown in FIG. 5, when movable structural body 13 is displaced in the in-plane direction of surface 1S of substrate 1A, movable structural body 13 comes into contact with first stopper member S1, so that excessive displacement of movable structural body 13 in the in-plane direction can be suppressed. In addition, as shown in FIG. 6, when movable structural body 13 is displaced toward substrate 1A in the out-of-plane direction of surface 1S of substrate 1A, movable structural body 13 comes into contact with second stopper member S2, so that excessive displacement of movable structural body 13 toward substrate 1A in the out-of-plane direction can be suppressed. In addition, as shown in FIG. 7, when movable structural body 13 is displaced to the side opposite to second stopper member S2 with respect to movable structural body 13 in the out-of-plane direction of surface 1S of substrate 1A, movable structural body 13 comes into contact with third stopper member S3, so that excessive displacement of movable structural body 13 to the side opposite to second stopper member S2 in the out-of-plane direction can be suppressed. Therefore, the excessive displacement of movable structural body 13 in the in-plane direction and out-of-plane direction can be suppressed, to thereby suppress the application of stress greater than or equal to the fracture stress to beam 12 supporting movable structural body 13. Consequently, damage to and breakage of beam 12 can be suppressed. Thus, variation in the characteristics of the acceleration sensor due to damage to and breakage of beam 12 can be suppressed.

In addition, according to the above acceleration sensor, as shown in FIG. 5, first stopper member S1 prevents movable structural body 13 from being displaced greater than first gap T1 in the in-plane direction of surface 1S of substrate 1A. In addition, as shown in FIGS. 6 and 7, second stopper member S2 and third stopper member S3 prevent movable structural body 13 from being displaced greater than second gap T2 and third gap T3 in the out-of-plane direction of surface 1S of substrate 1A.

Further, each of first gap T1, second gap T2 and third gap T3 has a dimension smaller than the amount of displacement that causes stress that causes a fracture of beam 12 due to displacement of movable structural body 13 in the in-plane direction and out-of-plane direction of surface 1S of substrate 1A. Thus, even if movable structural body 13 is displaced in the in-plane direction and out-of-plane direction of surface 1S of substrate 1A, stress greater than or equal to the fracture stress is not produced in beam 12 supporting movable structural body 13. Consequently, damage to and breakage of beam 12 can be suppressed.

The method of manufacturing the acceleration sensor as a method of manufacturing a semiconductor device of the present embodiment includes the following steps. Beam 12, movable structural body 13, first stopper member S1, second stopper member S2, third stopper member S3, and the first to third sacrificial films are formed. Beam 12 is supported by substrate 1A having surface 1S. Movable structural body 13 is supported by beam 12. First stopper member S1 is supported by substrate 1A, and is arranged at a distance from movable structural body 13 in the in-plane direction with respect to surface 1S. Second stopper member S2 is supported by first stopper member S1, and is arranged at a distance from movable structural body 13 in the out-of-plane direction with respect to surface 1S. Third stopper member S3 is supported by first stopper member S1, is arranged opposite to second stopper member S2 with movable structural body 13 interposed therebetween in the out-of-plane direction, and is arranged at a distance from movable structural body 13. First sacrificial film L1 (first sacrificial film) is formed between movable structural body 13 and first stopper member S1. Second sacrificial film L2 (second sacrificial film) is formed between movable structural body 13 and second stopper member S2. Third sacrificial film L3 (third sacrificial film) is formed between movable structural body 13 and third stopper member S3. An etching process is performed to remove the first sacrificial film, the second sacrificial film and the third sacrificial film, to form first to third gaps T1 to T3. First gap T1 is formed between movable structural body 13 and first stopper member S1. Second gap T2 is formed between movable structural body 13 and second stopper member S2. Third gap T3 is formed between movable structural body 13 and third stopper member S3.

According to the method of manufacturing the acceleration sensor described above, first gap T1 can be set by distance t1 between the patterns of first stopper member S1 and movable structural body 13 during the patterning of conductive film 10. Second gap T2 can be set by film thickness t2 of second sacrificial film L2. Third gap T3 can be set by film thickness t3 of third sacrificial film L3 directly above movable structural body 13. Consequently, first gap T1, second gap T2 and third gap T3 can be set separately. Design flexibility can be thereby improved.

Second Embodiment

Next, an acceleration sensor as a semiconductor device of a second embodiment of the present invention is described. In the following, the configuration and the manufacturing method of the present embodiment are substantially the same as the configuration and the manufacturing method of the first embodiment unless otherwise described, and therefore, the same elements are designated by the same reference characters and description thereof will not be repeated.

Figure 18:
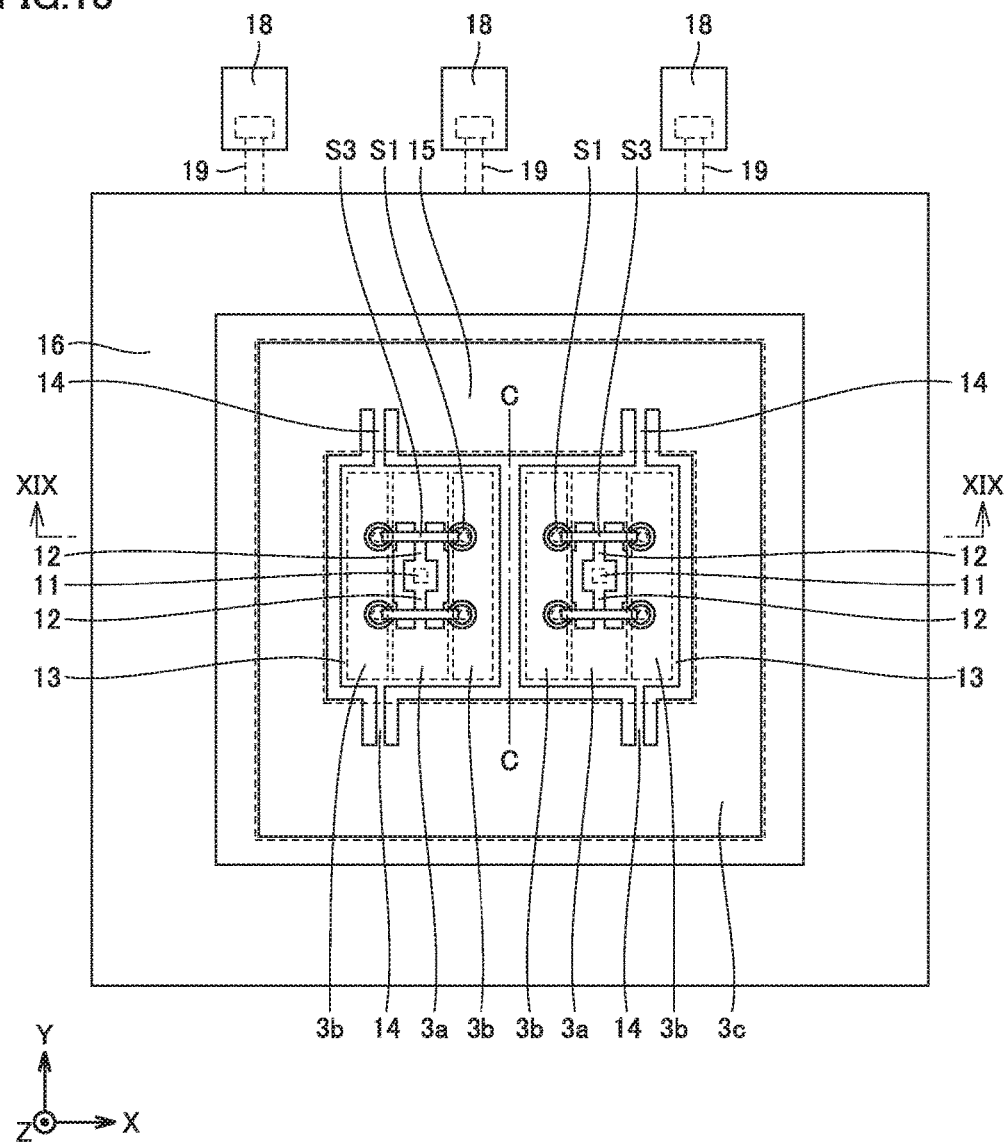
FIG. 18 is a plan view schematically showing the configuration of an acceleration sensor as a semiconductor device in a second embodiment of the present invention.
Figure 19:
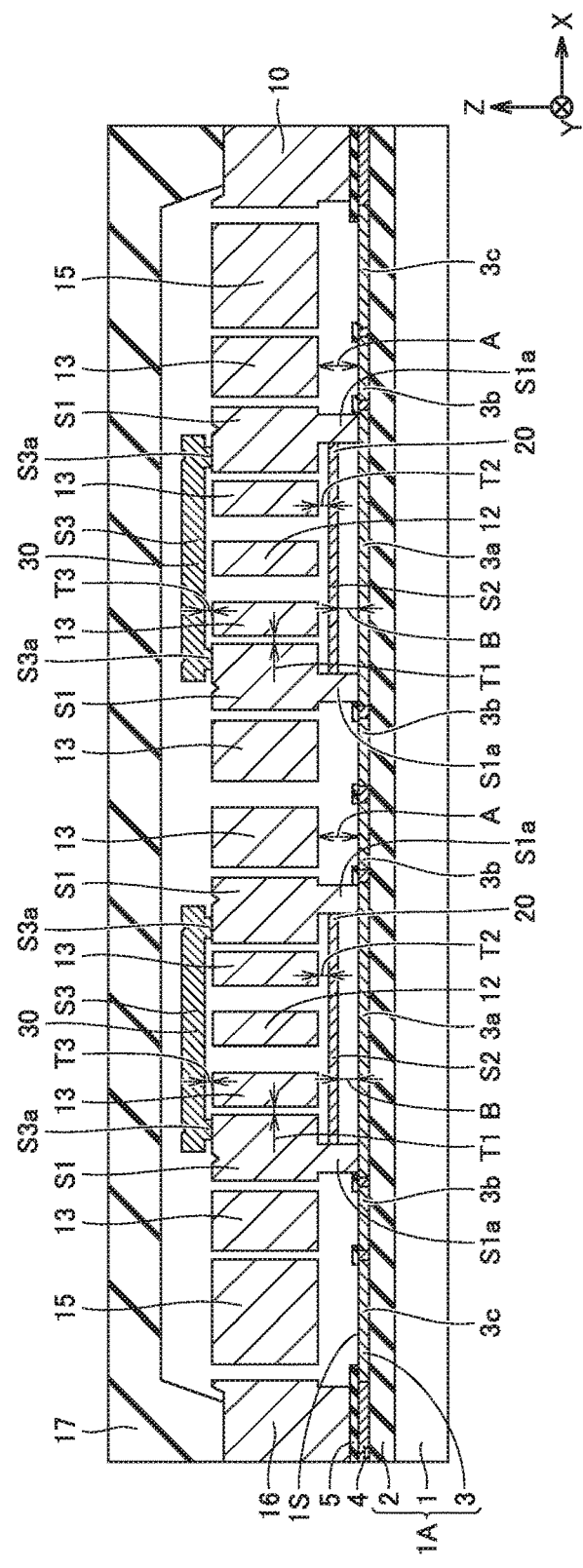
FIG. 19 is a schematic cross-sectional view taken along line XIX-XIX in FIG. 18.

With reference to FIGS. 18 and 19, the acceleration sensor of the present embodiment is mainly different in the arrangement of first stopper member S1, second stopper member S2 and third stopper member S3, as compared to the acceleration sensor of the first embodiment shown in FIGS. 1 and 2. It is noted that cap 17 is not shown in FIG. 18 for clarity.

In the acceleration sensor of the first embodiment, first stopper members S1 are arranged at positions shifted from beam 12 in the Y direction. In contrast, in the acceleration sensor of the present embodiment, first stopper members S1 are arranged at positions overlapping beam 12 in the Y direction. Further, first stopper members S1 are provided such that beam 12 lies therebetween in the X direction.

In addition, in the acceleration sensor of the first embodiment, second stopper member S2 is arranged at a position shifted from beam 12 in the Y direction. In contrast, in the acceleration sensor of the present embodiment, second stopper member S2 is arranged at a position overlapping beam 12 in the Y direction. Further, second stopper member S2 is provided to straddle beam 12 in the X direction. That is, second stopper member S2 is arranged to overlap beam 12 in the Z direction.

In addition, in the acceleration sensor of the first embodiment, third stopper member S3 is arranged at a position shifted from beam 12 in the Y direction. In contrast, in the acceleration sensor of the present embodiment, third stopper member S3 is arranged at a position overlapping beam 12 in the Y direction. Further, third stopper member S3 is provided to straddle beam 12 in the X direction. That is, third stopper member S3 is arranged to overlap beam 12 in the Z direction.

According to the present embodiment, each of second stopper member S2 and third stopper member S3 can be arranged in the vicinity of beam 12 in the Z direction. Consequently, the application of stress greater than or equal to the fracture stress to beam 12 in the Z direction can be effectively suppressed.

Third Embodiment

Next, an acceleration sensor as a semiconductor device of a third embodiment of the present invention is described. In the following, the configuration and the manufacturing method of the present embodiment are substantially the same as the configuration and the manufacturing method of the first embodiment unless otherwise described, and therefore, the same elements are designated by the same reference characters and description thereof will not be repeated.

Figure 20:
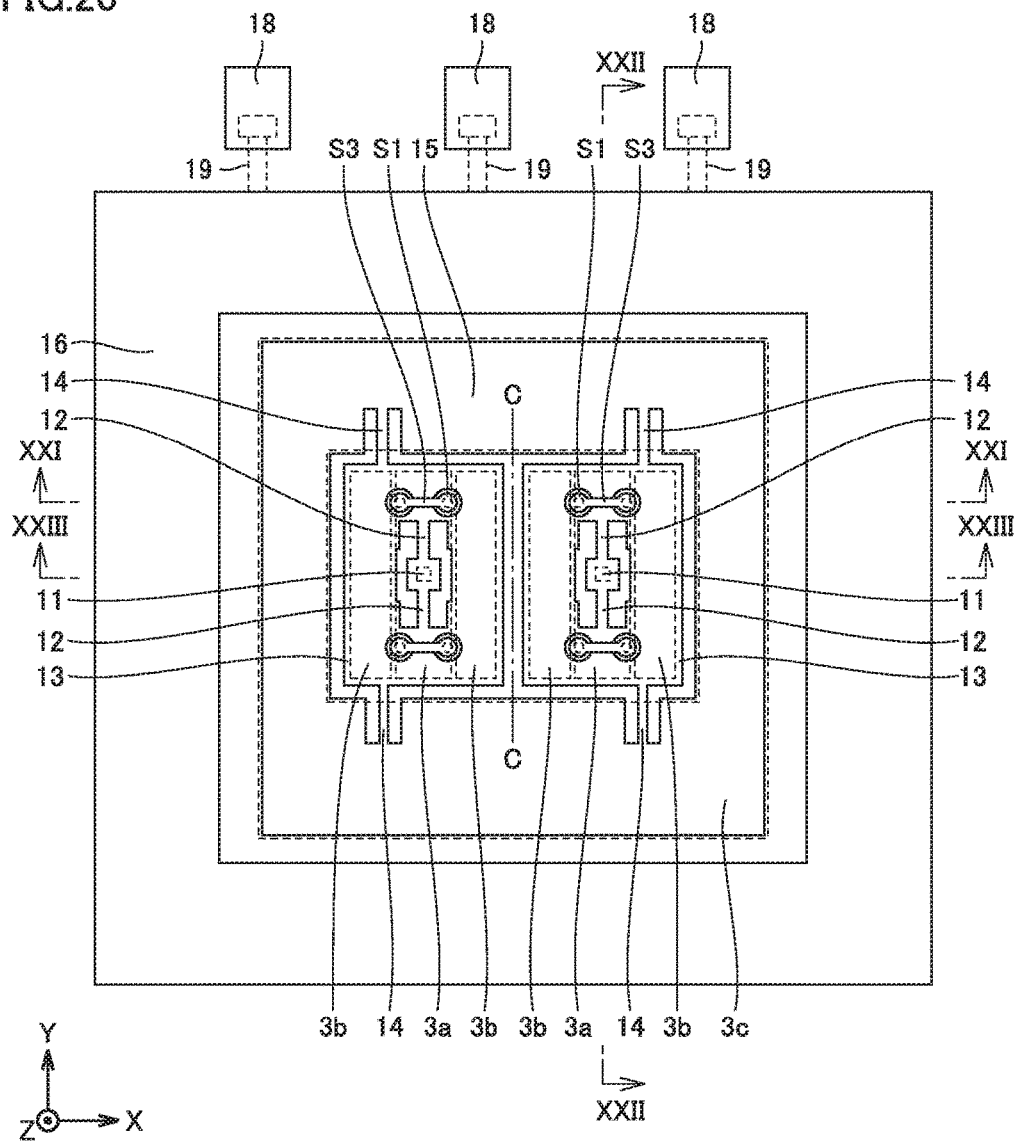
FIG. 20 is a plan view schematically showing the configuration of an acceleration sensor as a semiconductor device in a third embodiment of the present invention.
Figure 21:
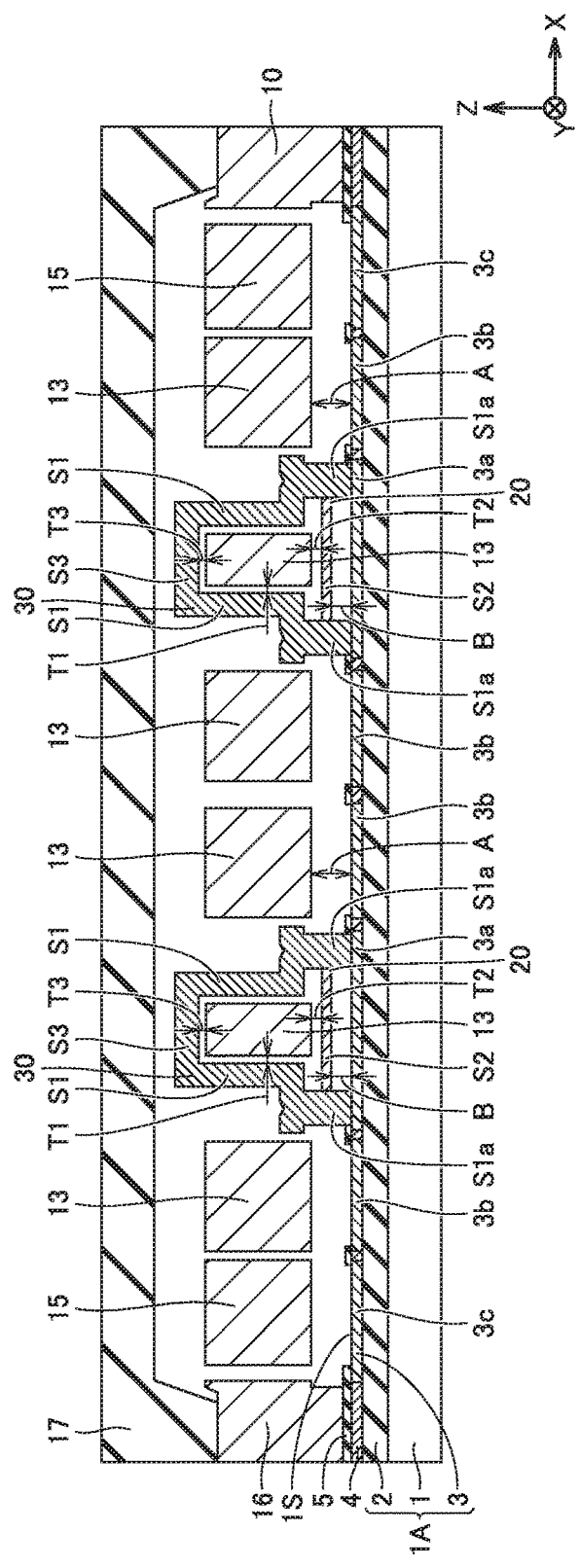
FIG. 21 is a schematic cross-sectional view taken along line XXI-XXI in FIG. 20.
Figure 22:
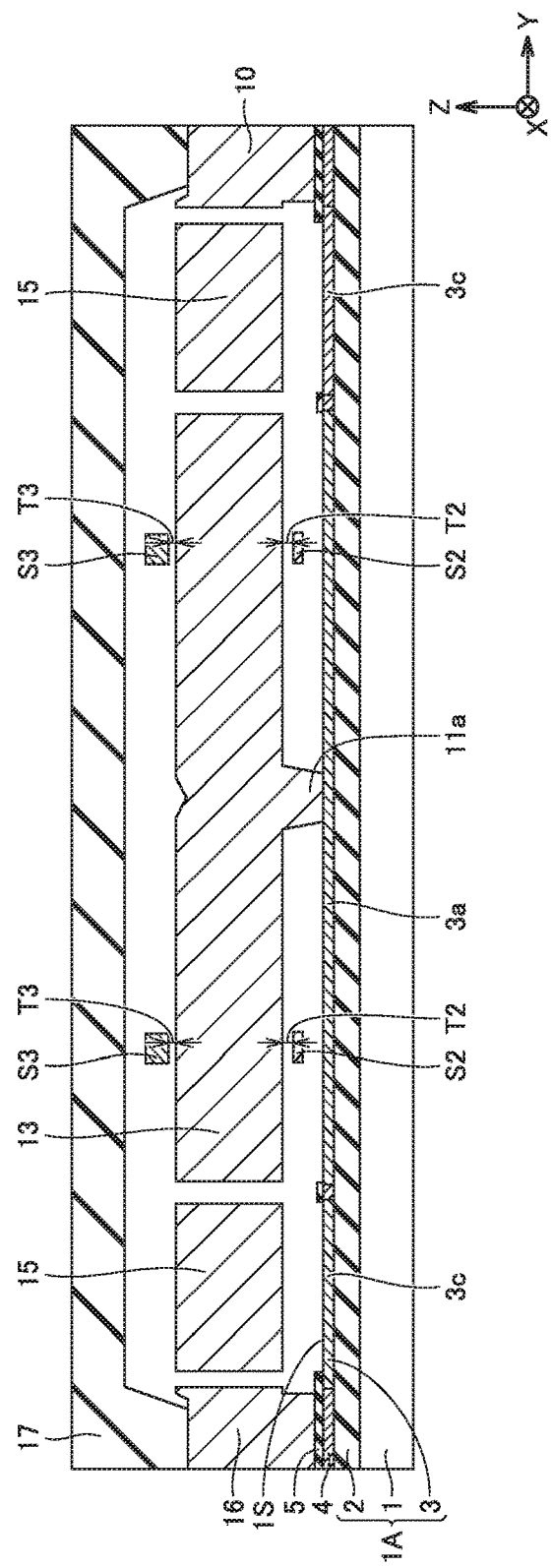
FIG. 22 is a schematic cross-sectional view taken along line XXII-XXII in FIG. 20.
Figure 23:
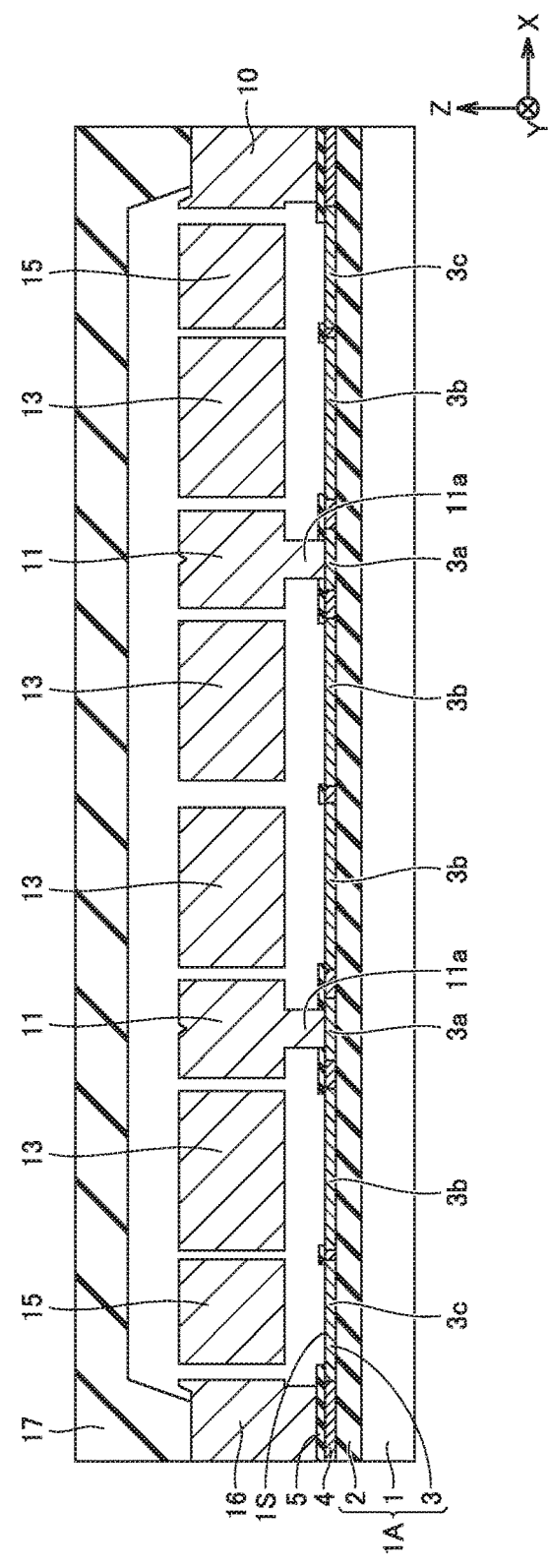
FIG. 23 is a schematic cross-sectional view taken along line XXIII-XXIII in FIG. 20.

With reference to FIGS. 20 and 21, in the first embodiment, first stopper member S1 formed of conductive film 30 and third stopper member S3 formed of conductive film 30 constitute a stacked structure. It is noted that cap 17 is not shown in FIG. 20 for clarity. In contrast, in the present embodiment, first stopper member S1 and third stopper member S3 are formed of the same film. First stopper member S1 and third stopper member S3 are formed to enclose movable structural body 13. It is noted that, with reference to FIGS. 22 and 23, the present embodiment has a configuration similar to that of the first embodiment shown in FIGS. 3 and 4.

Next, with reference to FIGS. 20 and 24 to 26, a description is given of a state in which an external force is applied to the acceleration sensor of the present embodiment in the in-plane direction and out-of-plane direction of surface 1S of substrate 1A. Examples of this external force include surface tension of liquid and an excessive impact force. Here, an example where acceleration is applied as an external force to the acceleration sensor of the present embodiment is described.

Figure 24:
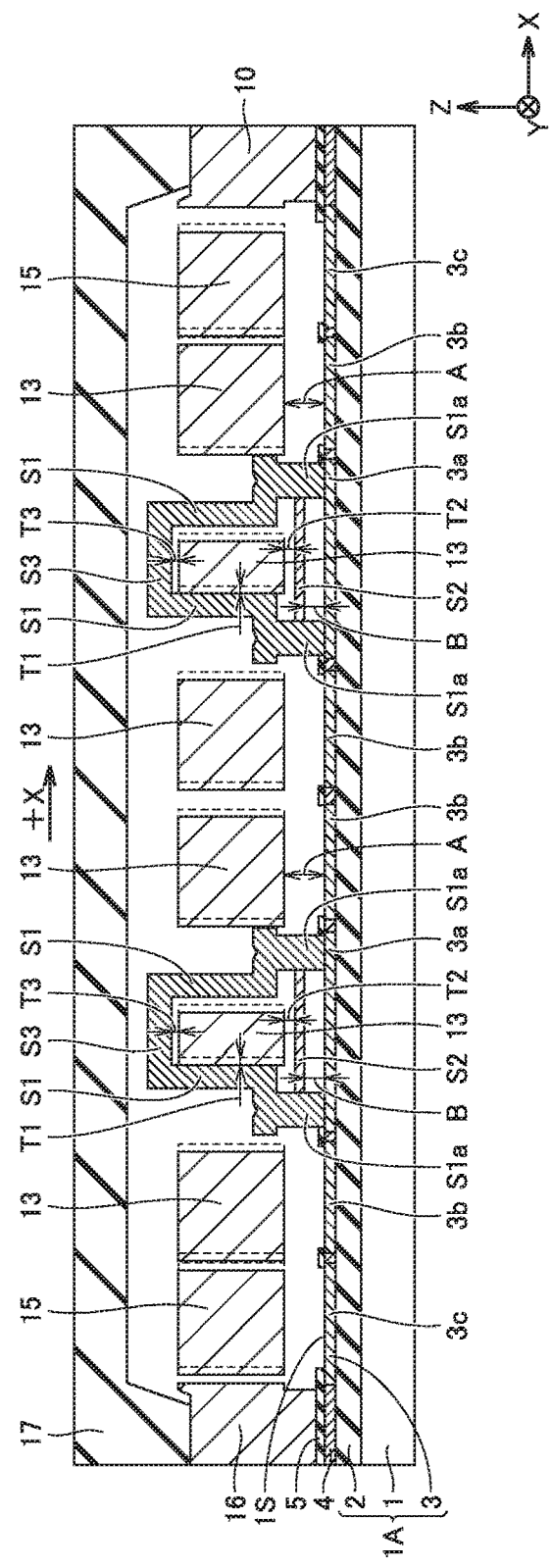
FIG. 24 is a schematic cross-sectional view for illustrating operation when acceleration is applied in the in-plane direction (+X direction) to the acceleration sensor as a semiconductor device in the third embodiment of the present invention.

With reference mainly to FIG. 24, when acceleration is applied to the acceleration sensor of the present embodiment in the +X direction of the arrow in the drawing in the in-plane direction, movable structural body 13 is displaced in the opposite direction (−X direction) to the +X direction of the arrow in the drawing. At this time, displaced movable structural body 13 comes into contact with first stopper member S1, and movable structural body 13 is thus prevented from being displaced greater than the dimension of first gap T1.

Figure 25:
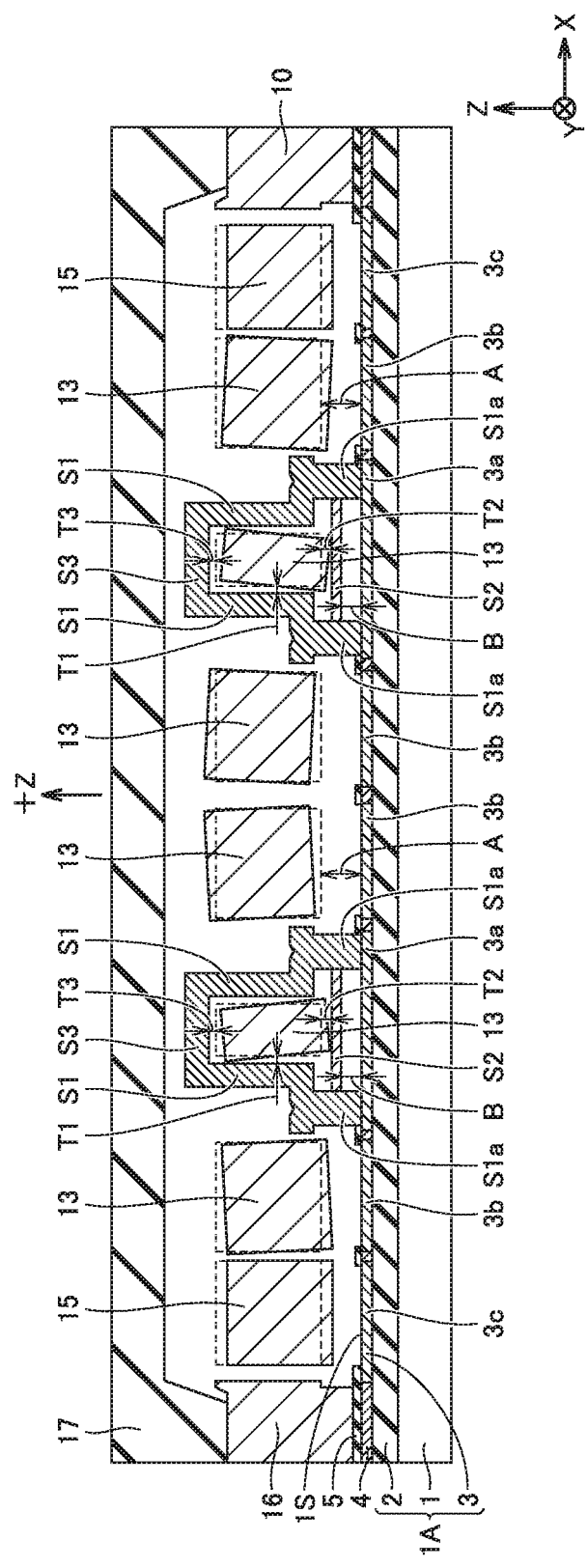
FIG. 25 is a schematic cross-sectional view for illustrating operation when acceleration is applied in the out-of-plane direction (+Z direction) to the acceleration sensor as a semiconductor device in the third embodiment of the present invention.

With reference mainly to FIG. 25, when acceleration is applied to the acceleration sensor of the present embodiment in the +Z direction of the arrow in the drawing in the out-of-plane direction, inertia mass body 15 is displaced in the opposite direction (−Z direction) to the +Z direction of the arrow in the drawing. This displacement of inertia mass body 15 is transferred to movable structural body 13 via link beam 14, causing movable structural body 13 to rotate around the axis of beam 12 extending in the Y direction. Consequently, a portion of movable structural body 13 facing second stopper member S2 is displaced in the −Z direction. Movable structural body 13 displaced in the −Z direction comes into contact with second stopper member S2, and movable structural body 13 is thus prevented from being displaced greater than the dimension of second gap T2.

Figure 26:
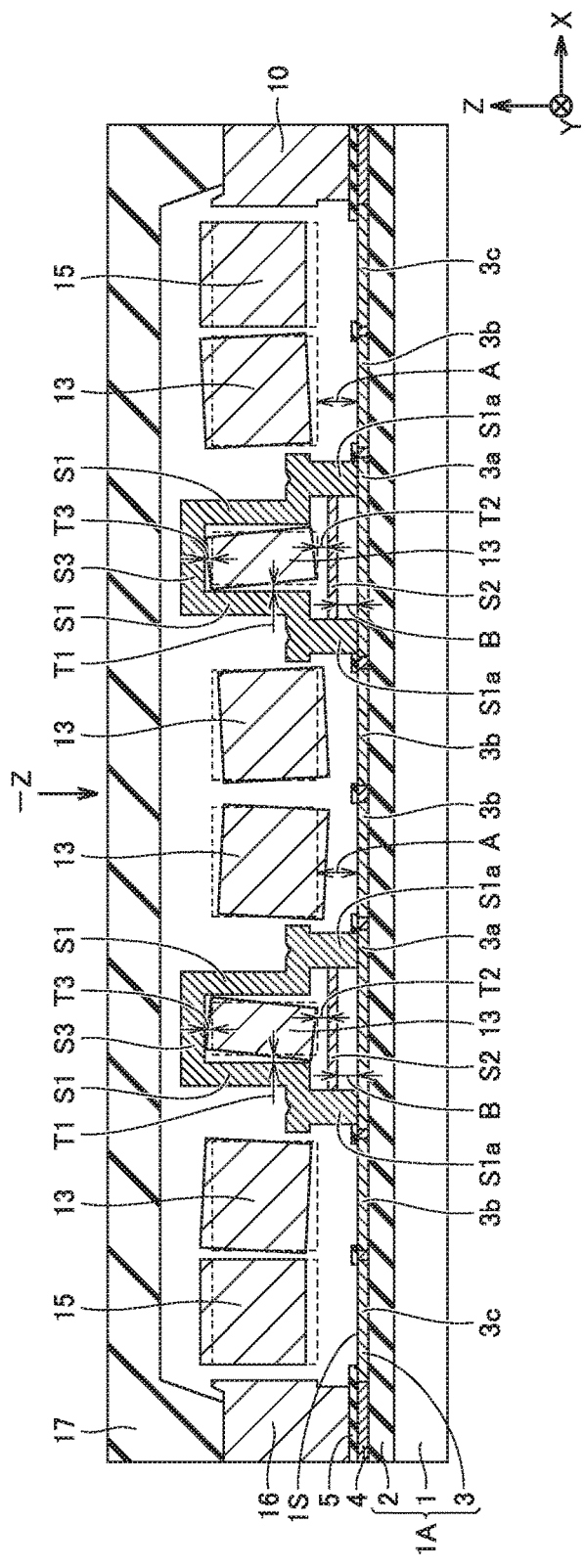
FIG. 26 is a schematic cross-sectional view for illustrating operation when acceleration is applied in the out-of-plane direction (−Z direction) to the acceleration sensor as a semiconductor device in the third embodiment of the present invention.

With reference mainly to FIG. 26, when acceleration is applied to the acceleration sensor of the present embodiment in the −Z direction of the arrow in the drawing in the out-of-plane direction, inertia mass body 15 is displaced in the opposite direction (+Z direction) to the −Z direction of the arrow in the drawing. This displacement of inertia mass body 15 is transferred to movable structural body 13 via link beam 14, causing movable structural body 13 to rotate around the axis of beam 12 extending in the Y direction. Consequently, a portion of movable structural body 13 facing third stopper member S3 is displaced in the +Z direction. Movable structural body 13 displaced in the +Z direction comes into contact with third stopper member S3, and movable structural body 13 is thus prevented from being displaced greater than the dimension of third gap T3.

Next, a method of manufacturing the acceleration sensor as a method of manufacturing a semiconductor device of the present embodiment is described using FIGS. 27 to 32.

Figure 27:
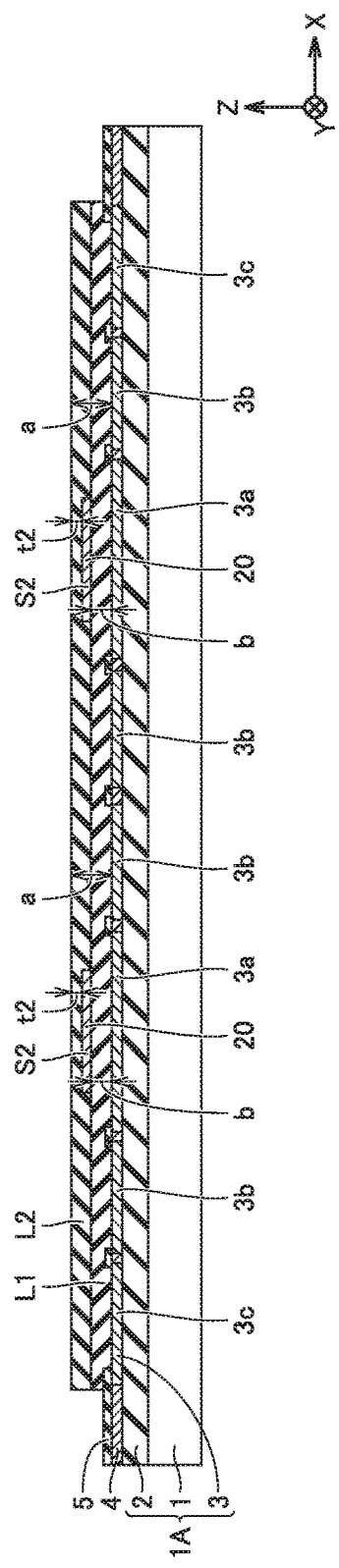
FIG. 27 is a schematic cross-sectional view showing a first step of a method of manufacturing the semiconductor device in the third embodiment of the present invention, which corresponds to the cross-sectional position of FIG. 2.

With reference to FIG. 27, the method of manufacturing the acceleration sensor of the present embodiment is similar to the manufacturing method of the first embodiment until second sacrificial film L2 is formed. After second sacrificial film L2 is formed, first sacrificial film L1 and second sacrificial film L2 are patterned using a photolithography technique and an etching technique, to form opening OP extending through first sacrificial film L1 and second sacrificial film L2 to reach second insulating film 4.

Figure 28:
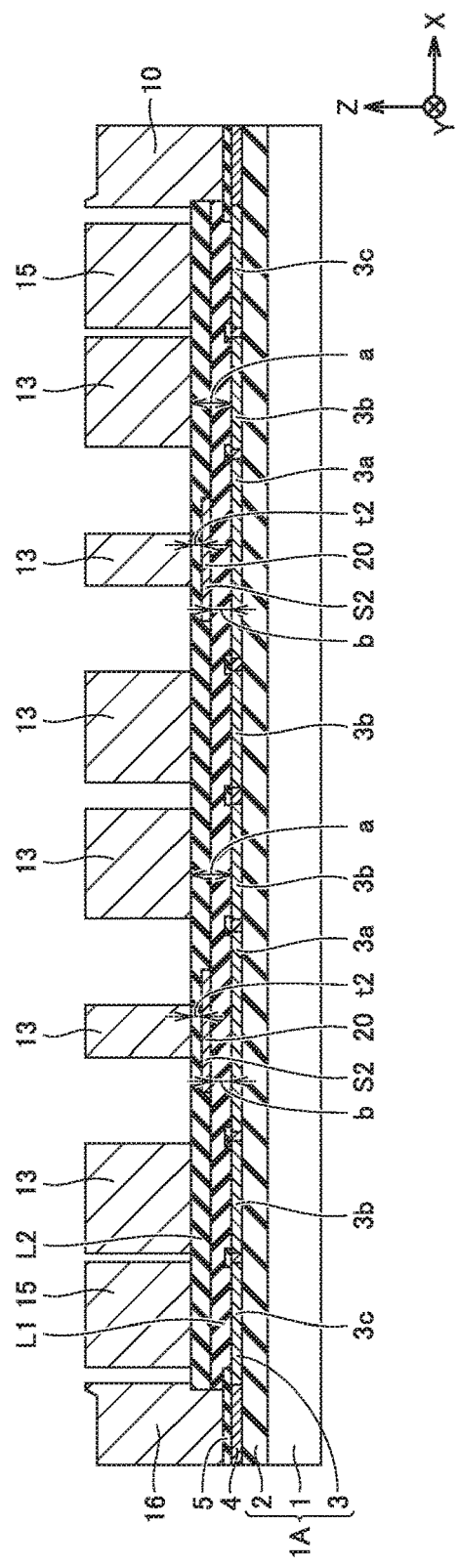
FIG. 28 is a schematic cross-sectional view showing a second step of the method of manufacturing the semiconductor device in the third embodiment of the present invention, which corresponds to the cross-sectional position of FIG. 2.

With reference to FIG. 28, conductive film 10 made of polycrystalline silicon, for example, is formed to cover second sacrificial film L2 and second insulating film 4. This conductive film 10 is formed to fill opening OP. A portion of conductive film 10 filling opening OP constitutes a part of sealing portion 16. This portion also constitutes support portion 11a of anchor portion 11 shown in FIGS. 22 and 23. This conductive film 10 is patterned using a photolithography technique and an anisotropic etching technique, to form the anchor portion (not shown), the beam (not shown), movable structural body 13, the link beam (not shown), inertia mass body 15 and sealing portion 16.

Figure 29:
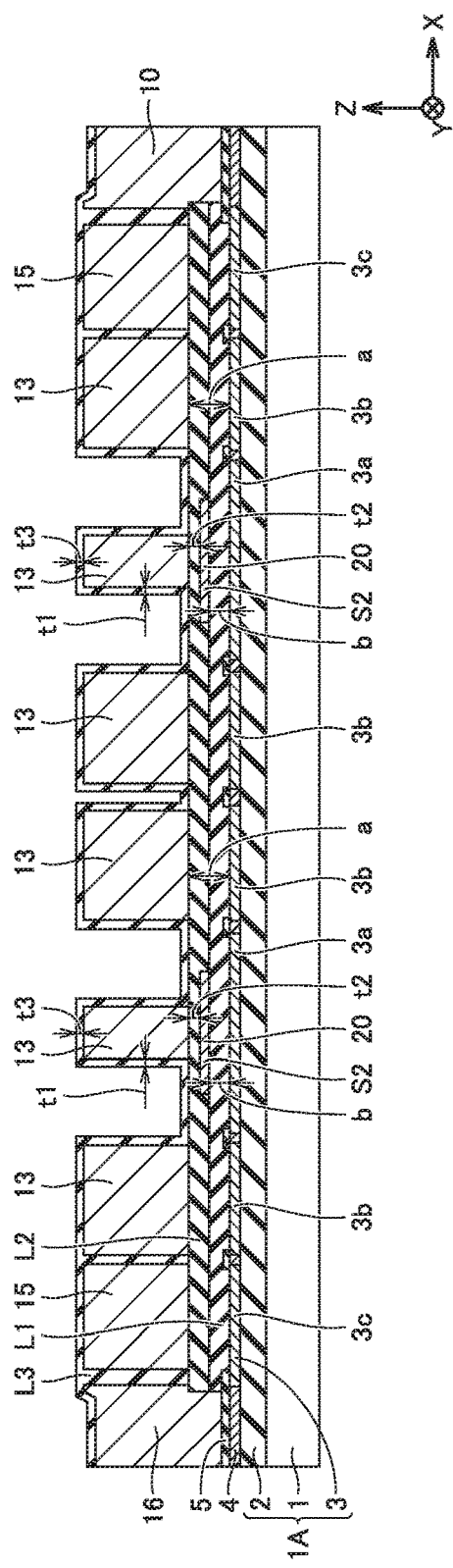
FIG. 29 is a schematic cross-sectional view showing a third step of the method of manufacturing the semiconductor device in the third embodiment of the present invention, which corresponds to the cross-sectional position of FIG. 2.

With reference to FIG. 29, third sacrificial film L3 formed of an insulating oxide film such as a TEOS (Tetra Ethyl Ortho Silicate) film is formed to cover the anchor portion (not shown), the beam (not shown), movable structural body 13, the link beam (not shown), inertia mass body 15, sealing portion 16 and second sacrificial film L2. Third sacrificial film L3 has a portion in contact with a sidewall of movable structural body 13, and is formed to have a film thickness t1 at this portion. This film thickness t1 will be the width of first gap T1 described above. Third sacrificial film L3 is also formed to have film thickness t3 directly above movable structural body 13. This film thickness t3 will be the thickness of third gap T3 in the Z direction described above. In the present embodiment, film thickness t1 and film thickness t3 are each the film thickness of third sacrificial film L3, and thus have the same dimension. Consequently, first gap T1 and third gap T3 have the same dimension.

Figure 30:
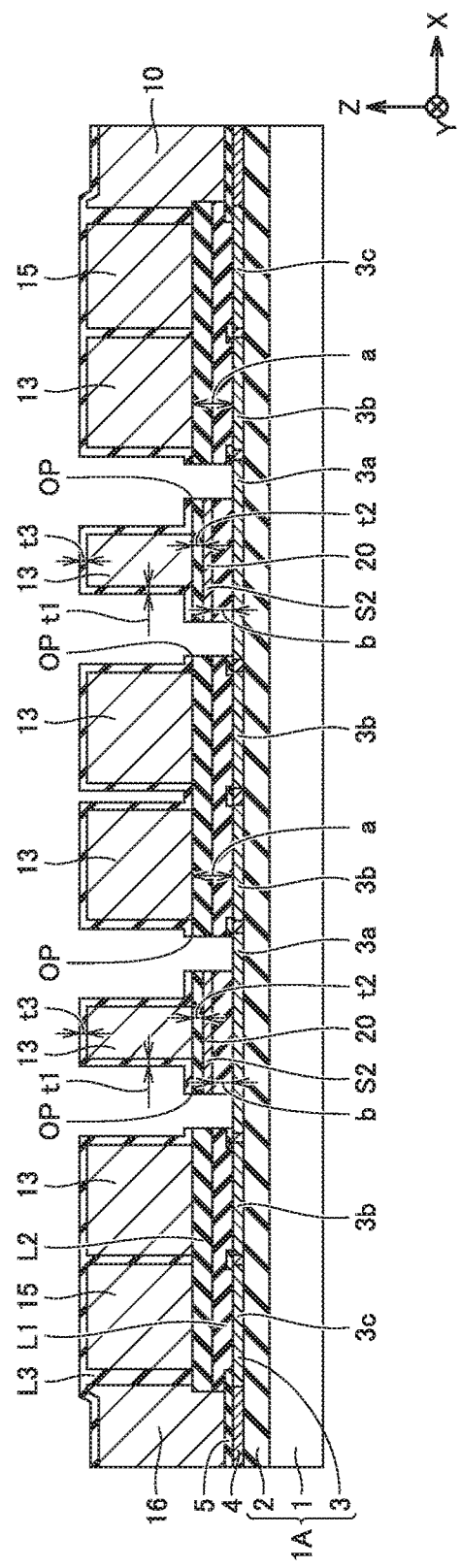
FIG. 30 is a schematic cross-sectional view showing a fourth step of the method of manufacturing the semiconductor device in the third embodiment of the present invention, which corresponds to the cross-sectional position of FIG. 2.

With reference to FIG. 30, first sacrificial film L1, second sacrificial film L2 and third sacrificial film L3 are patterned using a photolithography technique and an etching technique, to form opening OP extending through first sacrificial film L1, second sacrificial film L2 and third sacrificial film L3 to reach anchor support portion 3a.

Figure 31:
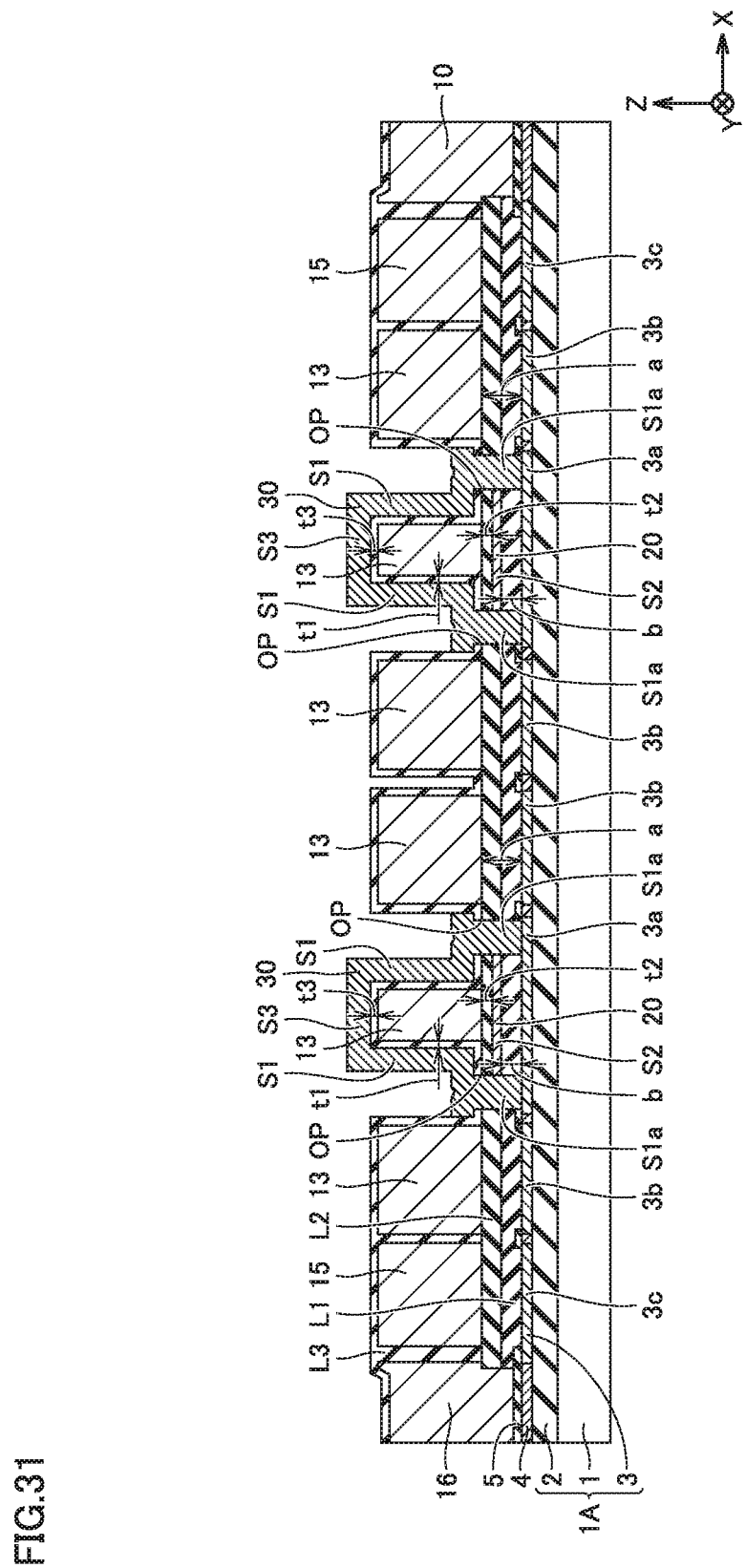
FIG. 31 is a schematic cross-sectional view showing a fifth step of the method of manufacturing the semiconductor device in the third embodiment of the present invention, which corresponds to the cross-sectional position of FIG. 2.

With reference to FIG. 31, conductive film 30 made of polycrystalline silicon, for example, is formed to cover third sacrificial film L3 and anchor support portion 3a. This conductive film 30 is formed to fill opening OP. A portion of conductive film 30 filling opening OP constitutes support portion S1a of first stopper member S1. This conductive film 30 is patterned using a photolithography technique and an anisotropic etching technique, to form first stopper member S1 and third stopper member S3.

Figure 32:
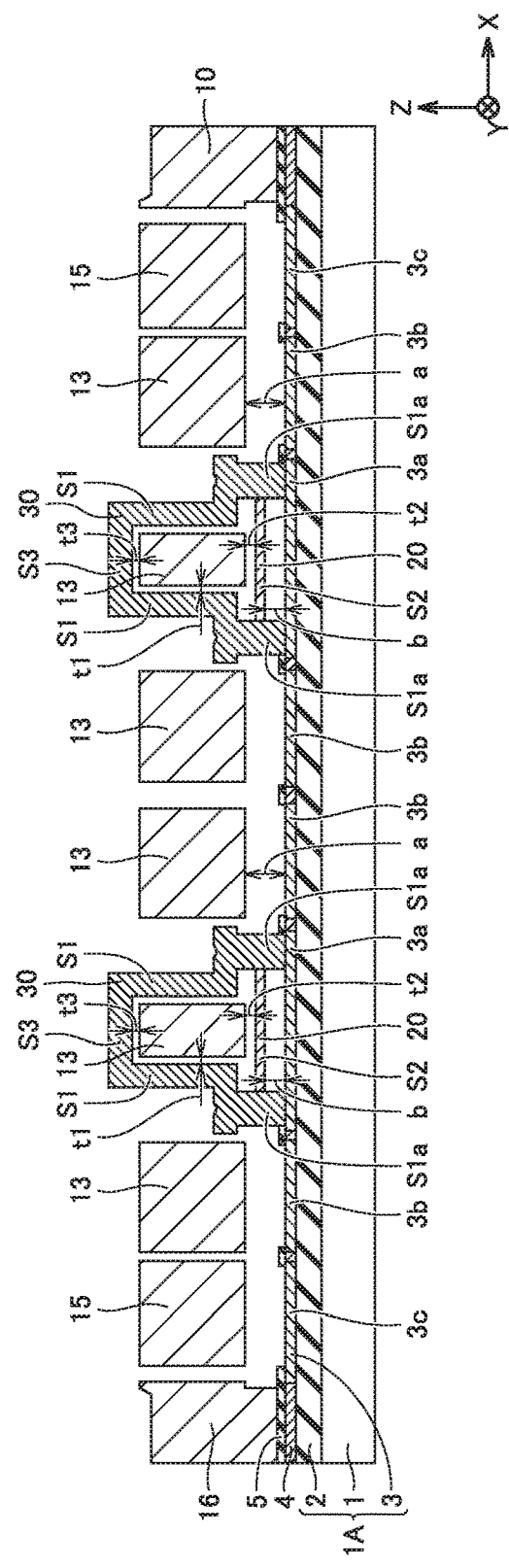
FIG. 32 is a schematic cross-sectional view showing a sixth step of the method of manufacturing the semiconductor device in the third embodiment of the present invention, which corresponds to the cross-sectional position of FIG. 2.

With reference to FIG. 32, a wet etching process with a hydrofluoric acid solution or the like is performed to remove a sacrificial layer formed of first sacrificial film L1, second sacrificial film L2 and third sacrificial film L3. Consequently, a support structure is formed in which the beam (not shown), movable structural body 13, the link beam (not shown) and inertia mass body 15 are supported by substrate 1A, with a gap from substrate 1A. Then, cap 17 shown in FIG. 2 is anodically bonded, for example, to sealing portion 16. Subsequently, assembly and sealing with molding resin is carried out to perform packaging.

Next, the function and effect of the present embodiment will be described.

In the acceleration sensor as a semiconductor device of the present embodiment, as shown in FIG. 21, first stopper member S1 and third stopper member S3 are formed of the same third sacrificial film L3. Consequently, first stopper member S1 and third stopper member S3 can be formed of the same film.

In the method of manufacturing the acceleration sensor as a method of manufacturing a semiconductor device of the present embodiment, first stopper member S1 and third stopper member S3 are simultaneously formed of the same third sacrificial film. Consequently, first stopper member S1 and third stopper member S3 can be simultaneously formed of the same film.

Fourth Embodiment

Next, an acceleration sensor as a semiconductor device of a fourth embodiment of the present invention is described. In the following, the configuration and the manufacturing method of the present embodiment are substantially the same as the configuration and the manufacturing method of the third embodiment unless otherwise described, and therefore, the same elements are designated by the same reference characters and description thereof will not be repeated.

Figure 33:
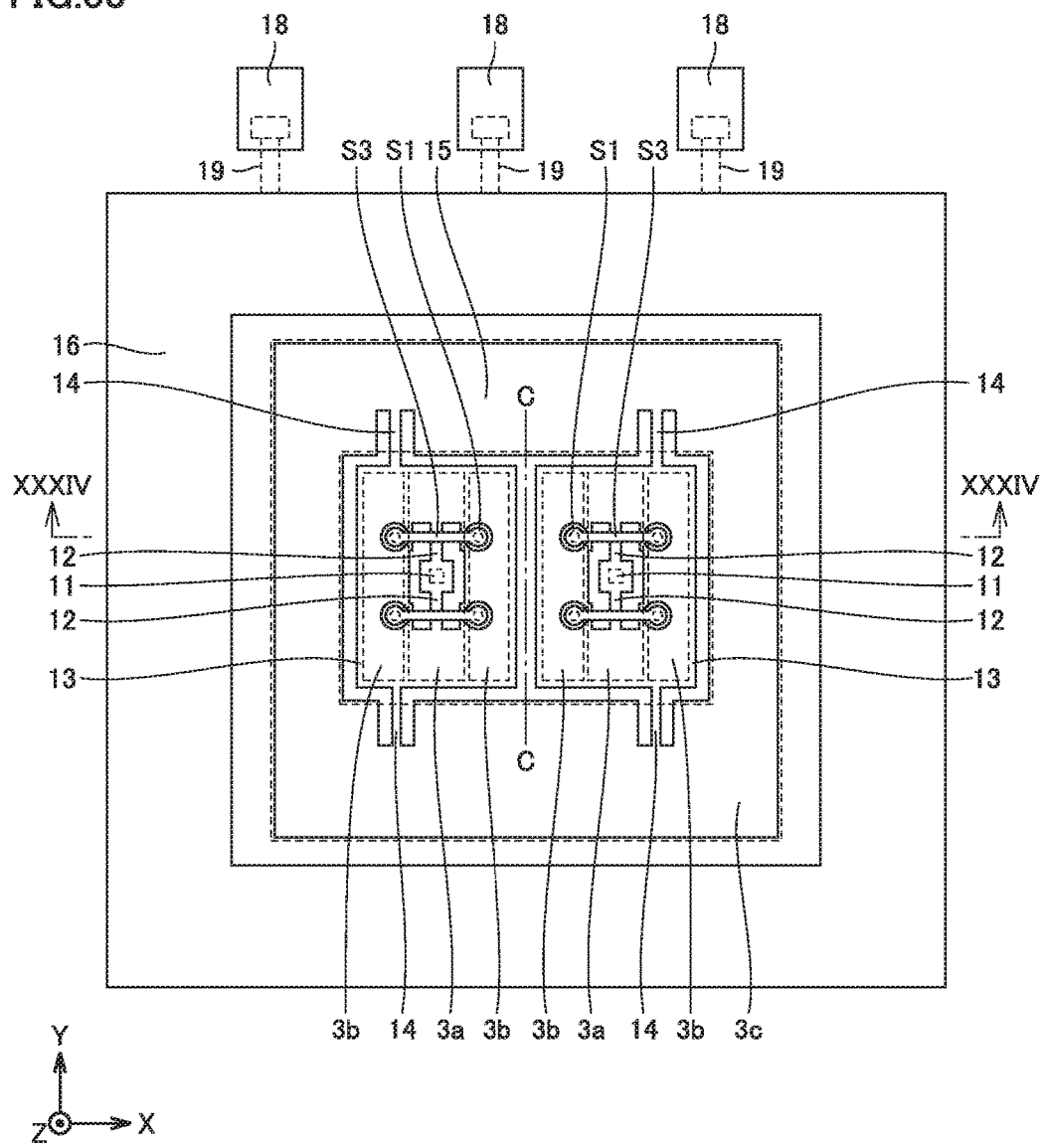
FIG. 33 is a plan view schematically showing the configuration of an acceleration sensor as a semiconductor device in a fourth embodiment of the present invention.
Figure 34:
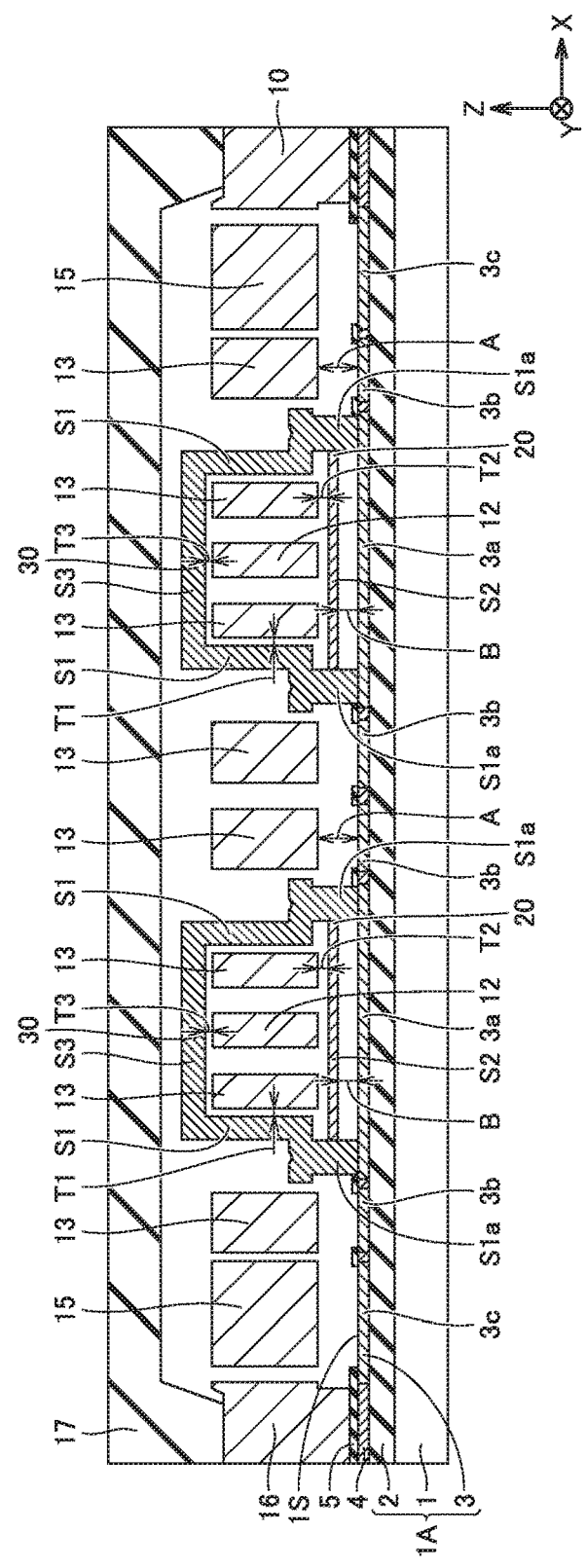
FIG. 34 is a schematic cross-sectional view taken along line XXXIV-XXXIV in FIG. 33.

With reference to FIGS. 33 and 34, the acceleration sensor of the present embodiment is mainly different in the configuration of first stopper member S1 and third stopper member S3, as compared to the acceleration sensor of the third embodiment shown in FIGS. 20 and 21. It is noted that cap 17 is not shown in FIG. 33 for clarity.

In the acceleration sensor of the third embodiment, first stopper members S1 are arranged at positions shifted from beam 12 in the Y direction. In contrast, in the acceleration sensor of the present embodiment, first stopper members S1 are arranged at positions overlapping beam 12 in the Y direction. Further, first stopper members S1 are provided such that beam 12 lies therebetween in the X direction.

In addition, in the acceleration sensor of the third embodiment, second stopper member S2 is arranged at a position shifted from beam 12 in the Y direction. In contrast, in the acceleration sensor of the present embodiment, second stopper member S2 is arranged at a position overlapping beam 12 in the Y direction. Further, second stopper member S2 is provided to straddle beam 12 in the X direction. That is, second stopper member S2 is arranged to overlap beam 12 in the Z direction.

In addition, in the acceleration sensor of the third embodiment, third stopper member S3 is arranged at a position shifted from beam 12 in the Y direction. In contrast, in the acceleration sensor of the present embodiment, third stopper member S3 is arranged at a position overlapping beam 12 in the Y direction. Further, third stopper member S3 is provided to straddle beam 12 in the X direction. That is, third stopper member S3 is arranged to overlap beam 12 in the Z direction.

According to the present embodiment, each of second stopper member S2 and third stopper member S3 can be arranged in the vicinity of beam 12 in the Z direction. Consequently, the application of stress greater than or equal to the fracture stress to beam 12 in the Z direction can be effectively suppressed.

It should be understood that the embodiments disclosed herein are illustrative and non-restrictive in every respect. The scope of the present invention is defined by the claims, rather than the description above, and is intended to include any modification within the meaning and scope equivalent to the terms of the claims.

REFERENCE SIGNS LIST 1 substrate body; 1A substrate; 1S surface; 2 first insulating film; 3, 10, 20, 30 conductive film; 3a anchor support portion; 3b detection electrode; 3c fixed electrode; 4 second insulating film; 5 third insulating film; 11 anchor portion; 12 beam; 13 movable structural body; 14 link beam; 15 inertia mass body; 16 sealing portion; 17 cap; 18 electrode pad; 19 wire; L1 first sacrificial film; L2 second sacrificial film; L3 third sacrificial film; OP hole; S1 first stopper member; S2 second stopper member; S3 third stopper member; T1 first gap; T2 second gap; T3 third gap.

The invention claimed is:

1. A method of manufacturing a semiconductor device, comprising:
   forming
      a beam supported by a substrate having a surface,
      a movable structural body supported by the beam,
      a first stopper member supported by the substrate and arranged at a distance from the movable structural body in an in-plane direction with respect to the surface,
      a second stopper member supported by the first stopper member and arranged at a distance from the movable structural body in an out-of-plane direction with respect to the surface,
      a third stopper member supported by the first stopper member, arranged opposite to the second stopper member with the movable structural body interposed therebetween in the out-of-plane direction, and arranged at a distance from the movable structural body,
      a first sacrificial film formed between the movable structural body and the first stopper member,
      a second sacrificial film formed between the movable structural body and the second stopper member, and
      a third sacrificial film formed between the movable structural body and the third stopper member; and
   performing an etching process to remove the first sacrificial film, the second sacrificial film and the third sacrificial film, to form a first gap between the movable structural body and the first stopper member, form a second gap between the movable structural body and the second stopper member, and form a third gap between the movable structural body and the third stopper member.

2. The method of manufacturing a semiconductor device according to claim 1, wherein the first stopper member and the third stopper member are simultaneously formed of an identical film.

* * * * *